(12) United States Patent
Lee

(10) Patent No.: US 8,093,111 B2
(45) Date of Patent: Jan. 10, 2012

(54) SEMICONDUCTOR DEVICE INCLUDING PARTIAL SILICON ON INSULATOR FIN STRUCTURE AND METHOD FOR FABRICATING THE SAME

(75) Inventor: Sang Don Lee, Guri-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 336 days.

(21) Appl. No.: 12/345,639

(22) Filed: Dec. 29, 2008

(65) Prior Publication Data
US 2010/0025740 A1  Feb. 4, 2010

(30) Foreign Application Priority Data

Jul. 29, 2008 (KR) .................. 10-2008-0073934
Nov. 17, 2008 (KR) .................. 10-2008-114008

(51) Int. Cl.
*H01L 21/00* (2006.01)
*H01L 21/84* (2006.01)
(52) U.S. Cl. ....... 438/152; 438/207; 438/213; 438/218; 438/430; 257/288; 257/365; 257/506; 257/E21.409
(58) Field of Classification Search .................. None
See application file for complete search history.

(56) References Cited

U.S. PATENT DOCUMENTS

| | | | |
|---|---|---|---|
| 7,422,960 B2 * | 9/2008 | Fischer ................. | 438/426 |
| 7,847,322 B2 * | 12/2010 | Yamada et al. .......... | 257/213 |
| 2005/0098094 A1 * | 5/2005 | Oh et al. ................ | 117/95 |
| 2005/0153490 A1 * | 7/2005 | Yoon et al. ............. | 438/164 |
| 2008/0035998 A1 * | 2/2008 | Ramaswamy et al. ..... | 257/347 |
| 2008/0099850 A1 * | 5/2008 | Jeon et al. ............. | 257/365 |
| 2008/0308863 A1 * | 12/2008 | Park et al. ............. | 257/330 |

FOREIGN PATENT DOCUMENTS

| KR | 10-2005-0044140 | 5/2005 |
|---|---|---|
| KR | 10-2007-0014610 | 2/2007 |

OTHER PUBLICATIONS

Yeo et al, A Partially Insulated Field-Effect Transistor (PiFET) as a Candidate for Scaled Transistors, IEEE Electron Device Letters, vol. 25, No. 6, Jun. 2004, pp. 387-389.*

Park et al., "Fully Integrated Advanced Bulk FinFETs Architecture Featuring Partially-Insulating Techinque for DRAM Cell Application of 40mm Generation and Beyond," Device Research Team, R&D Center, Samsung Electronics Co. (2006).

Kim et al., "A Study on Selective $Si_{0.8}Ge_{0.2}$ Etch using Polysilicon Etchant Diluted By $H_2O$ for Three-Dimensional Si Structure Application," presented at the Proc. Electrochemical Society Meeting Paris, France, Apr. 2003.

* cited by examiner

*Primary Examiner* — Marcos D. Pizarro
*Assistant Examiner* — Andrés Muñoz
(74) *Attorney, Agent, or Firm* — Marshall, Gerstein & Borun LLP

(57) ABSTRACT

A method for fabricating a semiconductor device comprises forming a partial-insulated substrate comprising an insulating region located below both a channel region of a cell transistor and one of a storage node contact region and a bit line contact region, and forming a cell transistor comprising a fin region on the partial-insulated substrate.

6 Claims, 21 Drawing Sheets (i)  (ii)

SEMICONDUCTOR DEVICE INCLUDING PARTIAL SILICON ON INSULATOR FIN STRUCTURE AND METHOD FOR FABRICATING THE SAME

CROSS-REFERENCE TO RELATED APPLICATIONS

Priority is claimed to Korean patent application number 10-2008-0073934 and 10-2008-0114008, filed Jul. 29, 2008 and Nov. 17, 2008, respectively, the entire respective disclosures of which are incorporated herein by reference.

BACKGROUND OF THE INVENTION

The invention relates generally to a method for fabricating a semiconductor device and, more specifically, to a technology of forming a cell transistor on a partial-insulated (PI) substrate.

In a system comprising a plurality of semiconductor devices, a semiconductor memory apparatus is configured to store data generated or processed therein. For example, if a request from a data processor such as a central processing unit (CPU) is received, the semiconductor memory apparatus outputs data to the data processor from unit cells therein or stores data processed by the data processor to the unit cells, according to an address transmitted with the request.

As data storage capacity of semiconductor memory apparatus has increased, sizes of semiconductor memory apparatus have not increased proportionally. Thus, various elements and components used for read or write operations in the semiconductor memory apparatus have also reduced in size. Accordingly, components and elements unnecessarily duplicated in the semiconductor memory apparatus, such as transistors or wires, are combined or merged to reduce the area occupied by each component. Particularly, the reduction of the size of unit cells included in the semiconductor memory apparatus affects improvement of integration.

Due to the high degree of integration of semiconductor devices, the size of, for example, a field effect transistor (FET) that includes bulk silicon as the body is smaller; problems such as a short channel effect and increase of leakage current as well known by a person having an ordinary skill in the art are occurred.

In order to prevent the short channel effect and increase of leakage current, a method for fabricating a semiconductor device to form a transistor over a substrate having a silicon on insulator (SOI) structure has been suggested. The SOI substrate includes an insulating film formed over a lower semiconductor substrate and a silicon film formed over the insulating film. When a floating body transistor is formed in the SOI substrate, a body of the transistor is formed in the silicon film formed over the insulating film. The body of the neighboring transistor is isolated by a device isolation film that is contacted to the insulating film in order to reduce the leakage current. Source and drain regions are formed using both sides of the three-dimensional transistor body, thereby increasing the channel length rather than a conventional two-dimensional plane structure.

However, when the transistor is formed over the SOI substrate, a floating body effect is generated. The SOI substrate includes an insulating film positioned between the semiconductor substrate and the silicon film. The SOI substrate has a capacitor structure. When charges move repeatedly through the body of the transistor, the charges are accumulated in the capacitor through generation and recombination of a bias and a carrier, thereby degrading the operation of the semiconductor device. The threshold voltage of the transistor fluctuates due to the charges accumulated in the capacitor. The capacitor repeatedly accumulates and emits the charges, thereby generating thermal energy. The generation of leakage current resulting from a field effect concentration is called a Kink effect.

In order to prevent degradation of the operation characteristic of the semiconductor device due to the structural characteristic of the SOI substrate, a partial-insulated (PI) substrate has been suggested. In the PI substrate, a portion of the silicon film is connected to the semiconductor substrate included in the bottom portion of the SOI substrate and the upper portion of the insulating film, thereby partially insulating the upper portion and the lower portion in the SOI substrate. Hereinafter, a method for fabricating a semiconductor device in the PI substrate is described.

FIGS. 1a and 1b are plane diagrams illustrating a mask structure for fabricating a general semiconductor memory apparatus. Specifically, FIG. 1a shows an ISO mask 102, a substrate connecting mask 104, a fin mask 106, and a gate mask 108 for manufacturing a unit cell of 8 $F^2$ including a fin transistor. FIG. 1b shows an ISO mask 112, a substrate connecting mask 114, a fin mask 116 and a gate mask 118 for manufacturing a unit cell of 6 $F^2$.

Hereinafter, a method for forming a fin transistor over a PI substrate with the mask shown in FIG. 1a or 1b is described.

FIGS. 2a to 2h are perspective diagrams illustrating a method for fabricating a general semiconductor device using a mask pattern shown in FIG. 1a.

Referring to FIG. 2a, a sacrificial film 204 is formed over a semiconductor (e.g., Si or SiGe) substrate 202. A first silicon film 206 is formed over the sacrificial film 204, and a first hard mask film (not shown) is formed over the first silicon film 206. The sacrificial film 204 has a different wet etching selectivity than those of the semiconductor substrate 202 and the first silicon film 206. After the first photoresist film (not shown) is coated over a first hard mask film, the photoresist film is patterned using the substrate connecting mask 104 shown in FIG. 1a. The first hard mask film is etched using a second photoresist film, and the first silicon film 206 and the sacrificial film 204 are etched as shown in FIG. 2b. The first hard mask film is removed.

Referring to FIG. 2c, a second silicon film 208 is formed over the structure including the first silicon film 206 and the sacrificial film 204, thereby obtaining a PI substrate.

Referring to FIG. 2d, after a second hard mask film 210 is formed over the PI substrate, a Shallow Trench Isolation (STI) process is performed to form a trench by an etching process using an ISO mask that defines an active region. As shown in FIG. 2e, the exposed sacrificial film 204 is selectively wet-etched. For example, when the sacrificial film 204 includes $Si_xGe_{1-x}$ where x is 0.8, i.e. $Si_{0.8}Ge_{0.2}$, the sacrificial film 204 except for the semiconductor substrate 202, the first silicon film 206, and the second silicon film 208 is selectively wet-etched using a mixture solution having a composition ratio of $HNO_3(70\%):HF(49\%):CH_3COOH(99.9\%):H_2O=40:1:2:57$ which is diluted in $H_2O$ to a proper concentration.

Referring to FIG. 2f, a vacant space formed by the STI process is filled with an isolation insulating film 212. The isolation insulating film 212 is planarized through a chemical mechanical polishing (CMP) process to expose the second hard mask film 210. Through the wet-etching process, the isolation insulating film 212 is etched at a given depth to adjust the height, and the second hard mask film 210 is removed, thereby exposing the top portion of the second silicon film 208 defined as an active region. In order to form a fin region, a third hard mask film (not shown) is deposited over the resulting structure including the top portion of the second silicon film 208. A second photoresist film (not shown) is coated over the third hard mask film (not shown). Thereafter, the second photoresist film is removed from a fin-expected region of the transistor using the fin mask 106. The third hard mask film and the isolation insulating film 212 are removed, thereby forming a trench 209 to form a fin channel region. After the fin channel region is formed through the above-described process, the second photoresist film and the third hard mask film are removed.

Referring to FIG. 2g, a gate insulating film (not shown) is formed over the first and second silicon films 206 and 208, the semiconductor substrate 202. A gate lower electrode 216 and a gate upper electrode 218 are formed over the structure including the gate insulating film. The trench 209 is filled by the gate lower electrode 216. A gate hard mask film 220 is deposited over the gate upper electrode 218.

After a third photoresist film (not shown) is coated over the gate hard mask film 220, the third photoresist film is patterned with a gate mask. As shown in FIG. 2h, the gate hard mask film 220, the gate upper electrode 218, and the gate lower electrode 216 are sequentially etched with the third photoresist film. After the gate pattern is completed, the third photoresist film is removed.

Using a similar process as manufacturing a unit cell of a DRAM, an LDD region of the cell transistor is formed, and a sidewall insulating film is formed at sidewalls of the gate pattern. Thereafter, the process for manufacturing a unit cell of a DRAM including a fin transistor is completed through a process for forming a cell transistor that includes forming a cell contact plug, forming a bit line contact and a bit line, forming a capacitor contact and a capacitor and forming a metal line.

FIG. 3 is a perspective diagram illustrating a problem of the semiconductor device shown in FIGS. 2a to 2h. Specifically, FIG. 3 shows a cross-section of the perspective diagram shown in FIG. 2f.

In a cross-section of the fin region after the isolation insulating film 212 is formed, a partial region between the first and second silicon films 206 and 208 is insulated from the semiconductor substrate 202 by the isolation insulating film 212. In the PI substrate, after the second silicon film 208 is formed, the sacrificial film 204 and the residual sacrificial film 204 except for the etched portion of the first silicon film 206 are selectively removed by a wet-etching process using the substrate connecting mask defined with the same width as that of the fin mask as shown in FIG. 2b, and then the isolation insulating film is filled. By using the fin mask defined with the same width as that of the substrate connecting mask in FIG. 2f, a fin region is formed only in the region which is not insulated between the semiconductor substrate 202 and the first and second silicon films 206, 208. As a result, the width of the fin region is substantially the same as that of the substrate connecting portion of the PI substrate.

When a misalignment occurs between the substrate connecting mask and the fin mask in the above-described fin cell transistor, the connected fin region and the silicon substrate of the fin channel do not correctly match each other. The fin region may be formed partially to be leaning toward the partial insulating region. In a general DRAM structure, a contact region connected to a bit line is located between two cell transistors formed over one active region, and a contact region connected to a storage node is positioned at both sides of the two cell transistors. If a misalignment occurs when the fin cell transistor is applied to cell structure of the DRAM, the two fin cell transistors formed over one active region cannot be formed to be symmetrical. As a result, operation characteristics between the source/drain of the two fin cell transistors are differentiated, so that characteristics of the cell transistors connected to both sides of one bit line are also changed.

When a fin transistor is formed over the PI substrate by the same method in a conventional method, a partial insulating region is formed in the bottom portion of the region connected to the bit line between the two neighboring fin transistors, and a partial insulating region is not formed in the bottom portion of the fin region of the fin transistor. As a result, there is a limit to decrease the short channel effect because the size of the partial insulating region is the same as the width of the active region in one side, and same as the length of the source/drain regions in the other side.

BRIEF SUMMARY OF THE INVENTION

Various embodiments of the invention are directed at providing a semiconductor device and a method for fabricating the same. In the semiconductor device, a partial insulating region in a partial insulating substrate is formed in a bottom portion of a fin channel region including a space between two neighboring fin transistors. As a result, fin height for a saddle-type fin transistor is uniform, and the punch-through phenomenon between a storage node contact region and a bit line contact region located in the bottom portion of the fin channel region are prevented through the partial insulating region, thereby reducing the short channel effect and stabilizing a threshold voltage.

According to an embodiment of the invention, a method for fabricating a semiconductor device comprises forming a partial-insulated substrate comprising an insulating region located below both a channel region of a cell transistor and one of a storage node contact region and a bit line contact region, and forming a cell transistor comprising a fin region on the partial-insulated substrate.

Preferably, the bit line contact region comprises an area between fin regions of neighboring cell transistors formed in an active region.

Preferably, the storage node contact region comprises areas outside fin regions of neighboring cell transistors formed in an active region.

Preferably, the partial-insulated substrate is formed by: forming a connection region below one of the storage node contact region and the bit line contact region, wherein the connection region is configured to connect an upper silicon layer to a lower semiconductor substrate; and determining an active region in the partial-insulated substrate and forming the insulating region concurrently.

Preferably, the connection region is formed by depositing a sacrificial layer on the lower semiconductor substrate; forming a first silicon layer on the sacrificial layer; etching the first silicon layer and the sacrificial layer to define the connection region; and forming a second silicon layer on the first silicon layer and the lower semiconductor substrate.

Preferably, the second silicon layer corresponds to the connection region and the upper silicon layer.

Preferably, the first silicon layer and the sacrificial layer are etched by depositing a first hard mask layer on the first silicon layer; coating a photoresist layer on the first hard mask layer; patterning the photoresist layer using a substrate connection mask; etching the first hard mask layer using a patterned photoresist layer; etching the first silicon layer and the sacrificial layer using an etched first hard mask layer; and removing the first hard mask layer.

Preferably, the substrate connection mask exposes the channel region and the bit line contact region on the partial-insulated substrate.

Preferably, the substrate connection mask exposes a partial portion of the storage node contact region, the channel region, and the bit line contact region on the partial-insulated substrate.

Preferably, the substrate connection mask exposes the storage node contact region and a partial portion of the channel region on the partial-insulated substrate.

Preferably, the active region in the partial-insulated substrate is defined and the insulating region is concurrently formed by: forming a trench through a Shallow Trench Isolation (STI) process using an ISO mask configured to define the active region; performing a wet-etch process to the sacrificial layer exposed by the trench to form the insulating region; and forming an isolation insulating layer in the trench and the insulating region.

Preferably, the cell transistor is formed by: etching the isolation insulating layer by using a fin mask; forming a gate oxide layer on exposed active region by the fin mask; and forming a gate electrode on the gate oxide layer.

Preferably, the sacrificial layer includes $Si_xGe_{1-x}$ (x is 0.8), and an etchant used during the wet etch process comprises $HNO_3$ (70% purity), HF (49% purity), $CH_3COOH$ (99.9% purity), and $H_2O$, wherein a ratio of $HNO_3:HF:CH_3COOH:H_2O$ is 40:1:2:57.

Preferably, the sacrificial layer has an etch selectivity different from those of the upper silicon layer and the lower semiconductor substrate.

According to another embodiment of the invention, a semiconductor device comprises a partial-insulated substrate comprising a connection region configured to connect an upper silicon layer to a lower semiconductor substrate and an insulating region configured to electrically disconnect the upper silicon layer to the lower semiconductor substrate, a channel region, and a source/drain region over the insulating region, and a gate electrode on the channel region.

Preferably, the connection region is located below a partial portion of the channel region and a bit line contact region.

Preferably, the bit line contact region includes an area between fin regions of neighboring cell transistors formed in an active region.

Preferably, the connection region is located below a partial portion of the channel region and a storage node contact region.

Preferably, the storage node contact region includes areas outside fin regions of neighboring cell transistors formed in an active region.

Preferably, the insulating region is located below the channel region, a bit line contact region, and a partial portion of a storage node contact.

Preferably, the semiconductor device further comprises a gate oxide layer between the channel region and the gate electrode and a spacer at sidewalls of the gate electrode.

BRIEF DESCRIPTION OF THE DRAWINGS

FIGS. 2a to 2h are perspective diagrams illustrating a method fabricating a general semiconductor device using a mask pattern shown in FIG. 1a.

FIGS. 5a to 5h are perspective diagrams illustrating a method for fabricating a semiconductor memory apparatus using a mask pattern shown in FIG. 4a.

FIGS. 8a to 8h are perspective diagrams illustrating a method for fabricating a semiconductor memory apparatus using a mask pattern shown in FIG. 7a.

DESCRIPTION OF EMBODIMENTS

The invention will be described in more detail with reference to the accompanying drawings.

Figure 1A:
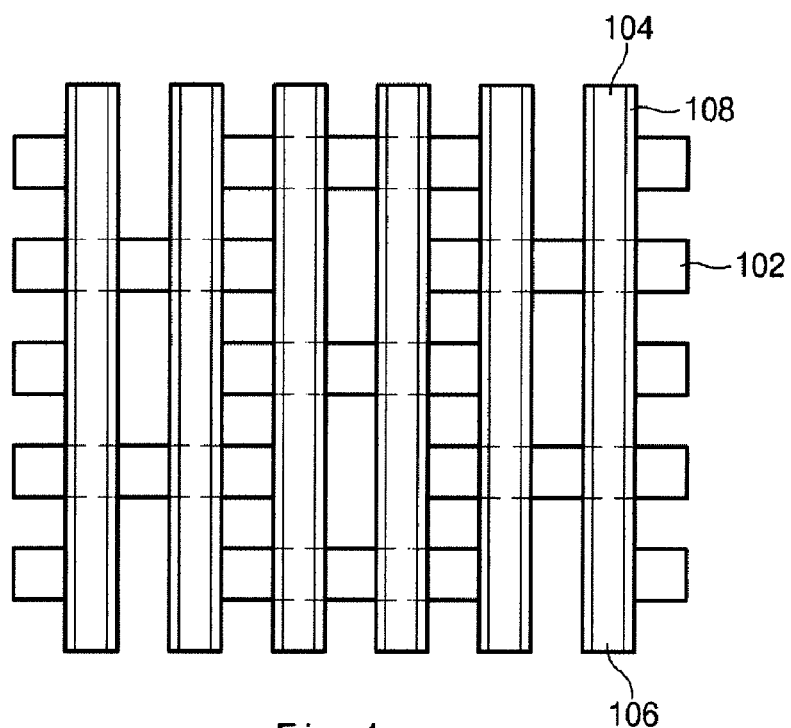
FIGS. 1a and 1b are plane diagrams illustrating a mask structure for fabricating a general semiconductor memory apparatus.
Figure 1B:
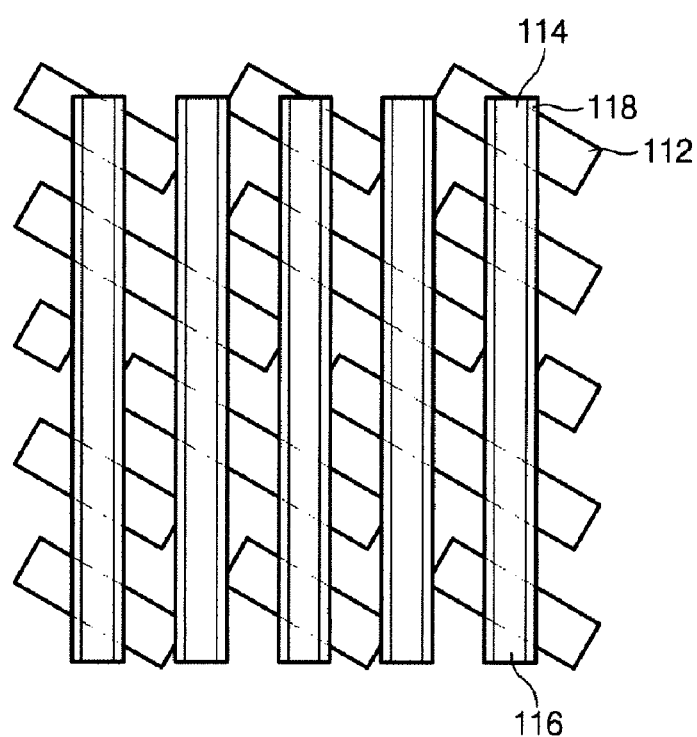
Figure 2A:
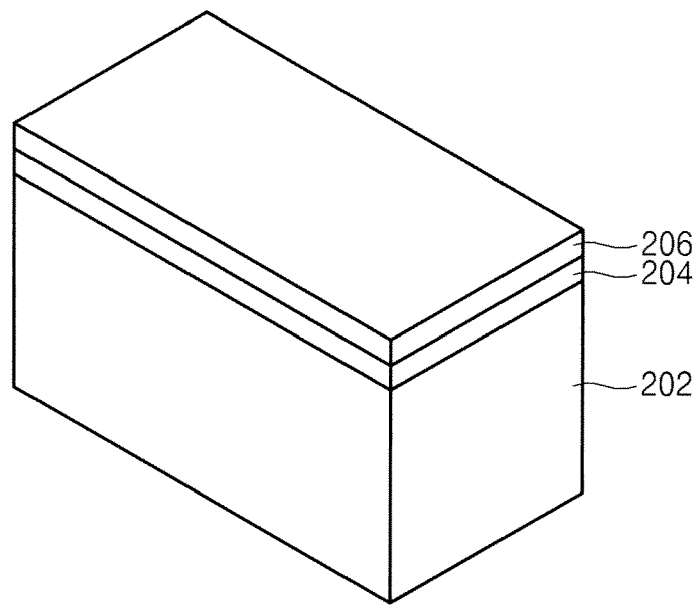
Figure 2B:
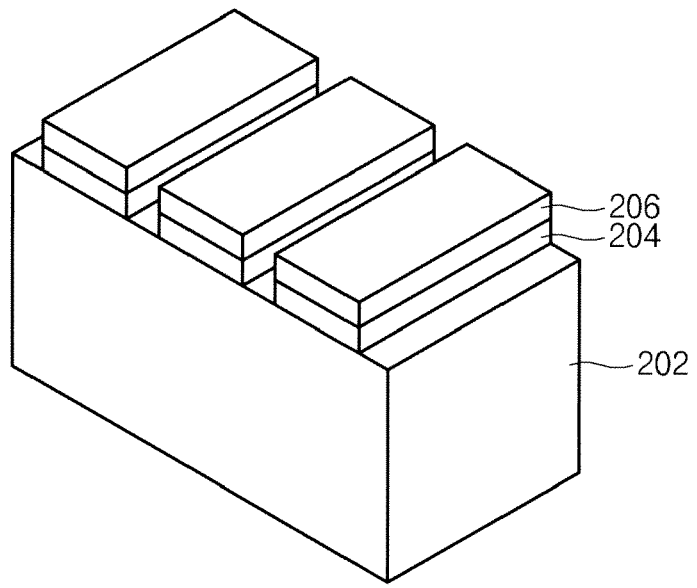
Figure 2C:
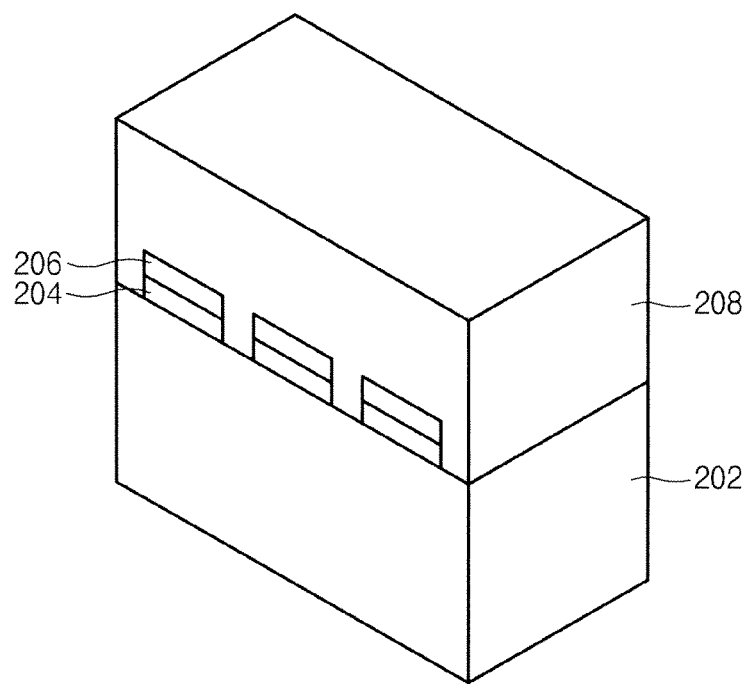
Figure 2D:
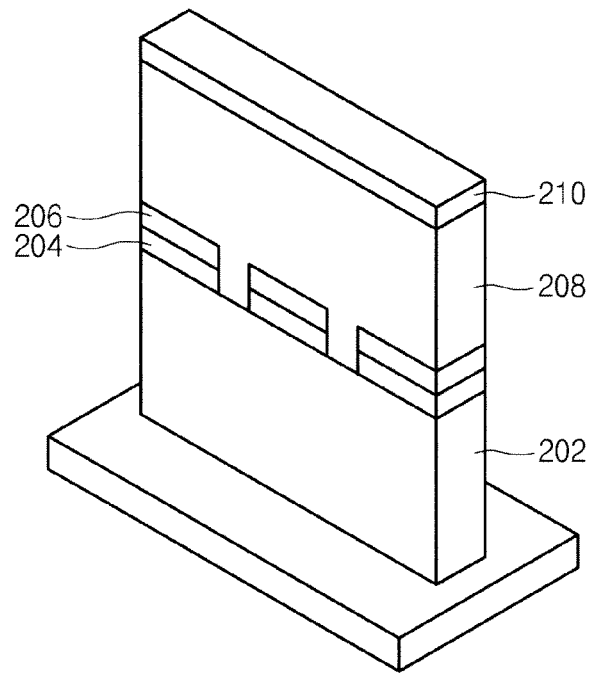
Figure 2E:
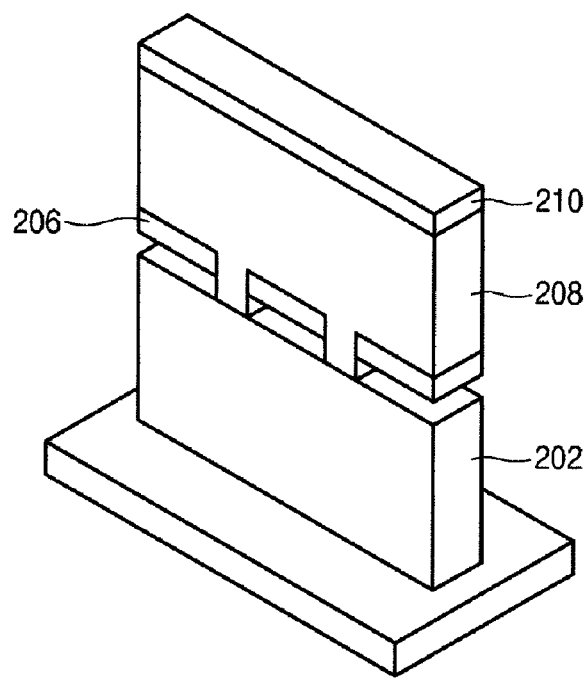
Figure 2F:
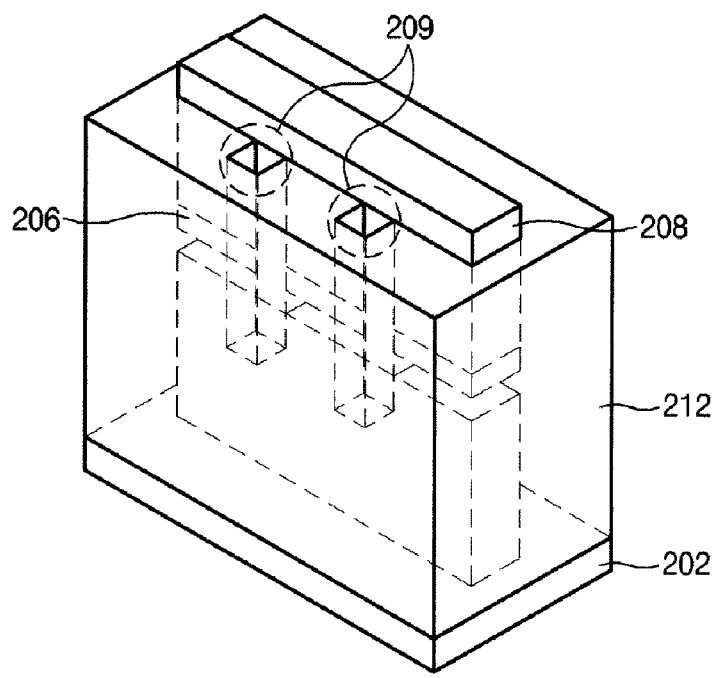
Figure 2G:
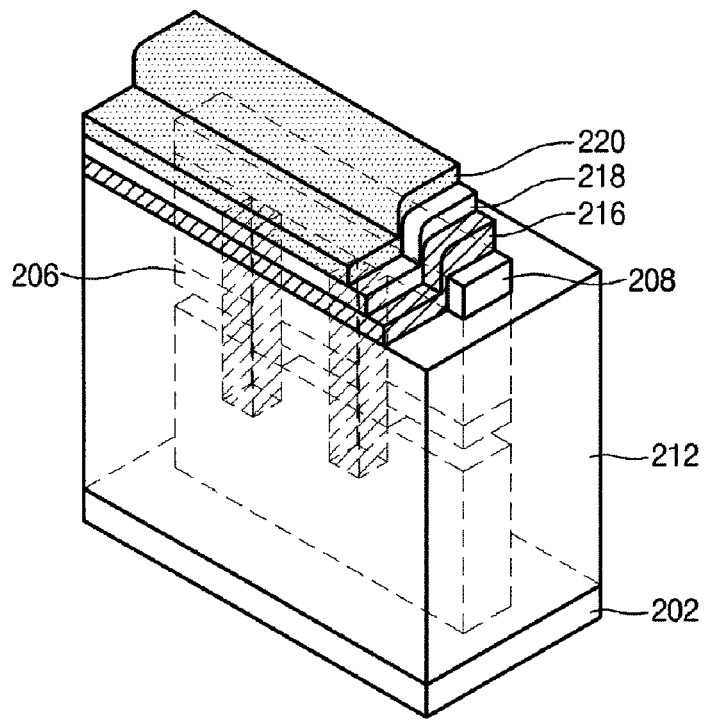
Figure 2H:
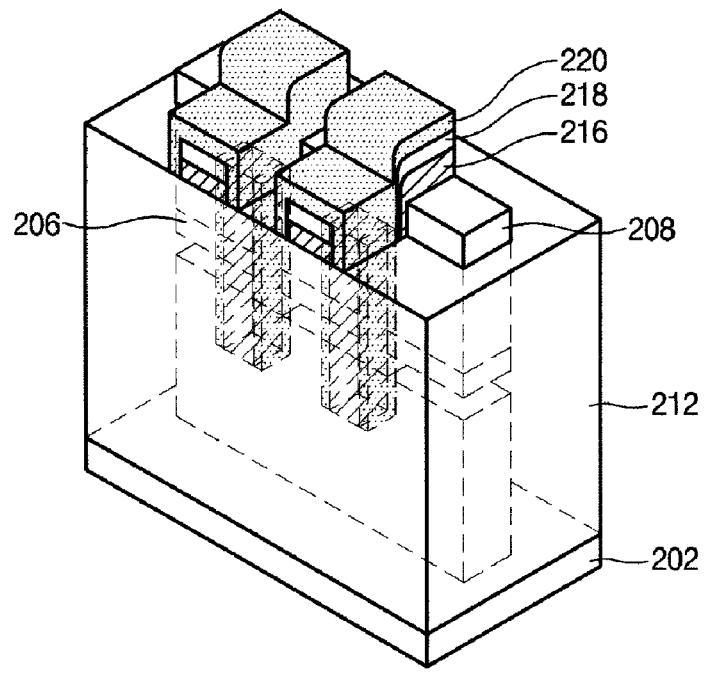
Figure 3:
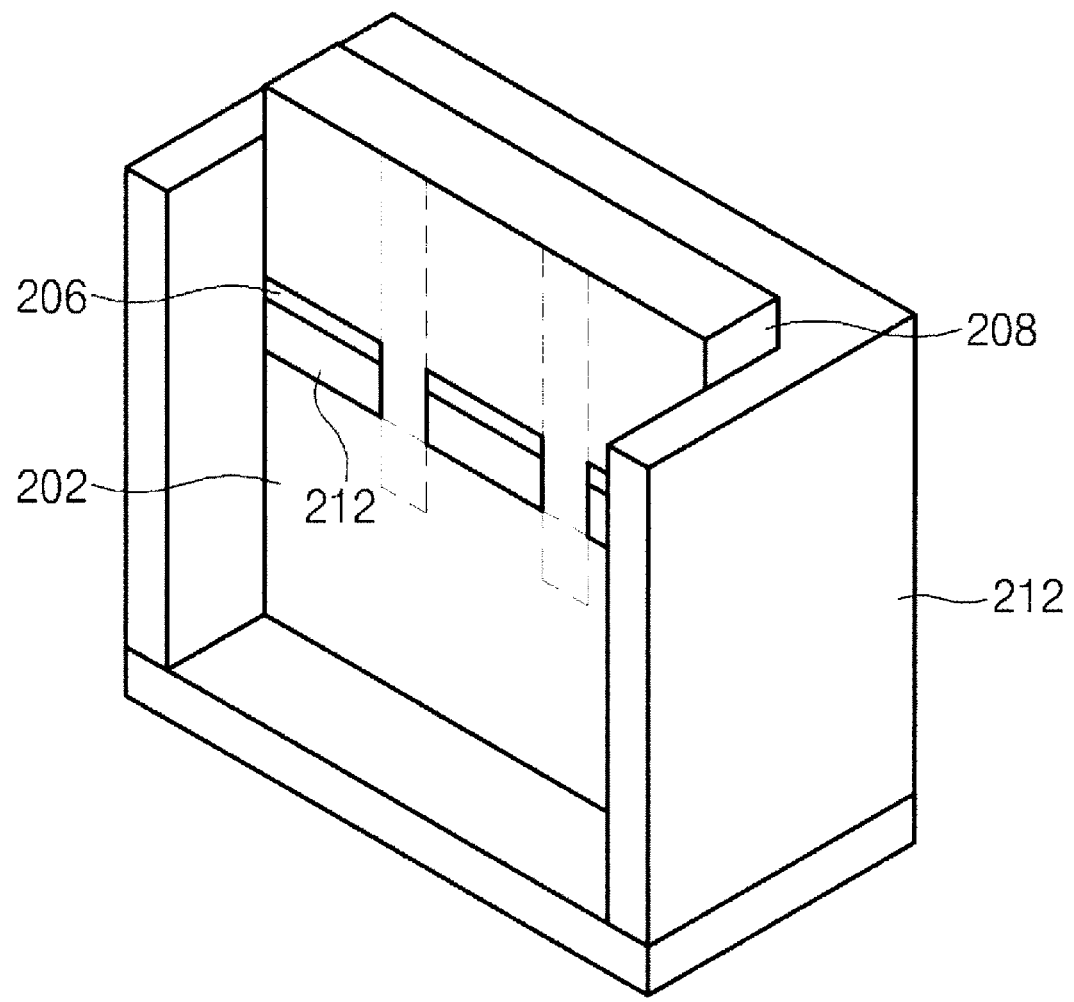
FIG. 3 is a perspective diagram illustrating a problem of the semiconductor device shown in FIGS. 2a to 2h.
Figure 4A:
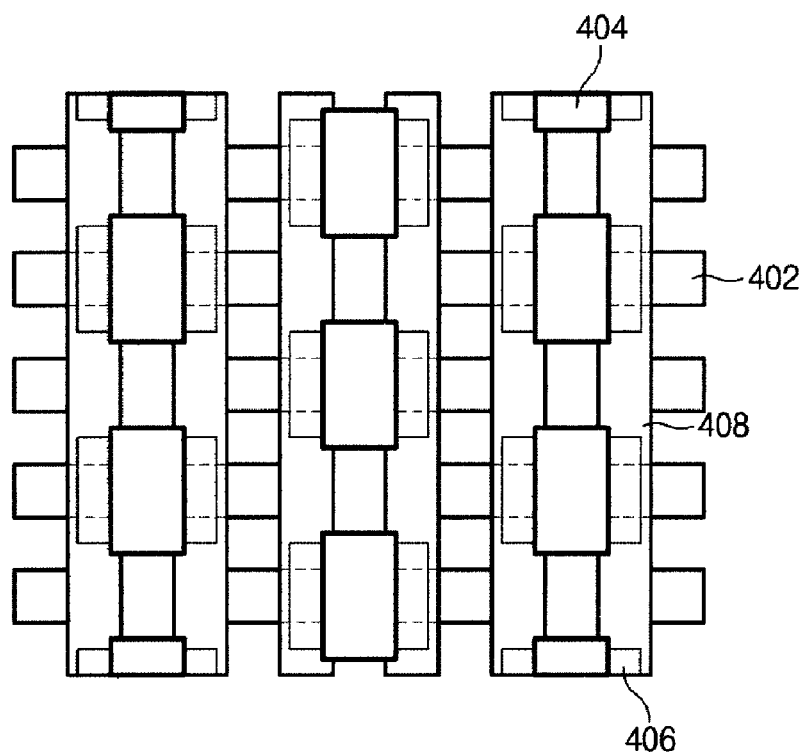
FIGS. 4a and 4b are plane diagrams illustrating a mask structure for fabricating a semiconductor memory apparatus according to an embodiment of the invention.
Figure 4B:
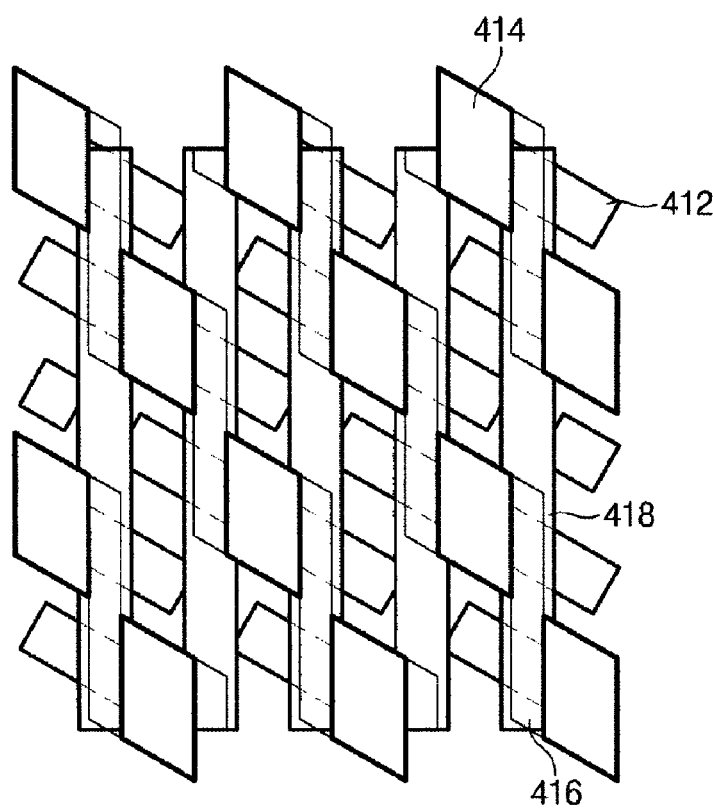

FIGS. 4a and 4b are plane diagrams illustrating a mask structure for fabricating a semiconductor memory apparatus according to an embodiment of the invention. Specifically, FIG. 4a shows an ISO mask 402, a substrate connecting mask 404, a fin mask 406, and a gate mask 408 for manufacturing a unit cell of 8 $F^2$ including a fin transistor. FIG. 4b shows an ISO mask 412, a substrate connecting mask 414, a fin mask 416, and a gate mask 418 for manufacturing a unit cell of 6 $F^2$.

Referring to FIGS. 4a and 4b, the substrate connecting masks 404 and 414 define exposed regions, and each includes a larger area than both a region between the fin regions formed at the bottom of neighboring gate patterns in a horizontal direction and the active region in a vertical direction.

In the conventional art, by the substrate connecting mask 104 and the fin mask 106 that define the same region, both a width of a region to connect a lower semiconductor substrate to an upper silicon film in a partial insulating substrate, which is formed by using the substrate connecting mask 104, and a width of a fin region formed using the fin mask 106 are defined identically to cause misalignment. However, in an embodiment of the invention, a partial insulating region is located in a lower portion of a fin channel region of a transistor, and a substrate connection region is formed between the neighboring transistors. Thus, since the fin channel region of the transistor is formed over the partial insulating region, although there is a limit in the height of the fin region in the embodiment of the invention, the misalignment can be prevented. The height limit of the fin region due to formation of the partial insulating region can be overcome by forming the thickness of the upper silicon film to be thicker, corresponding to the height of the fin channel region.

Hereinafter, a method is described for fabricating a semiconductor device for forming a saddle-type fin transistor including a fin region over a partial insulating substrate using the substrate connecting mask 404 and the fin mask 406 defined as the same region as shown in FIGS. 4a and 4b.

FIGS. 5a to 5h are perspective diagrams illustrating a method for fabricating a semiconductor memory apparatus using a mask pattern shown in FIG. 4a.

Figure 5A:
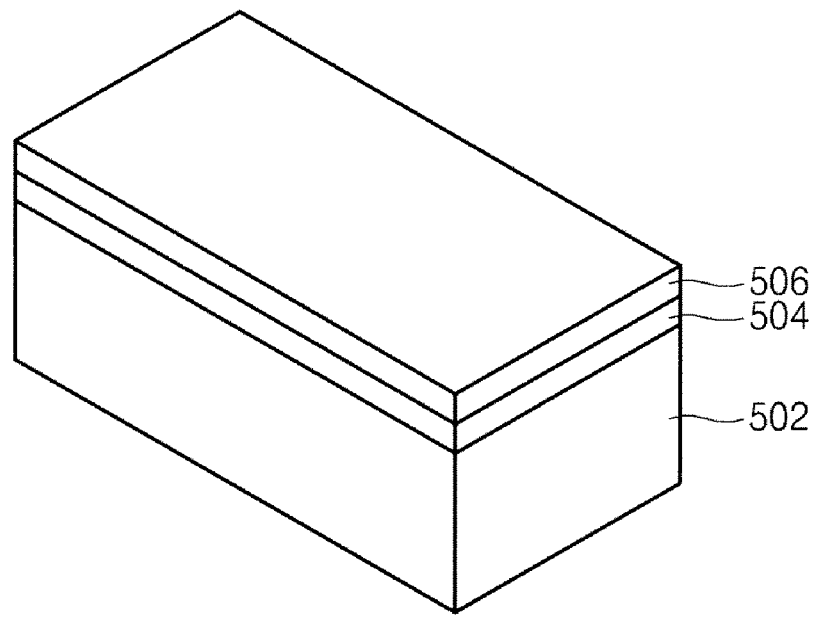

Referring to FIG. 5a, a sacrificial film 504 is formed over a semiconductor (e.g., Si or SiGe) substrate 502. A first silicon film 506 is formed over the sacrificial film 504, and a first hard mask film (not shown) is formed over the first silicon film 506. The sacrificial film 504 has a different wet etching selectivity from that of the semiconductor substrate 502 and the first silicon film 506 as well as a lattice constant value that is not much different from that of the first silicon film 506.

Figure 5B:
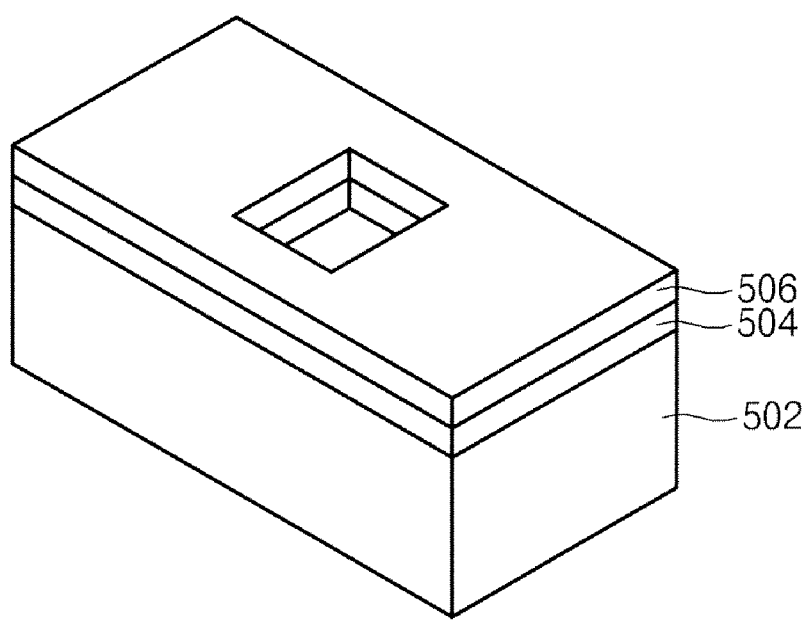

After a first photoresist film (not shown) is coated over a first hard mask film, the photoresist film is patterned using the substrate connecting mask 404 or 414 shown in FIGS. 4a and 4b. The first hard mask film is etched using a second photoresist film, and the first silicon film 506 and the sacrificial film 504 are etched as shown in FIG. 5b.

Figure 5C:
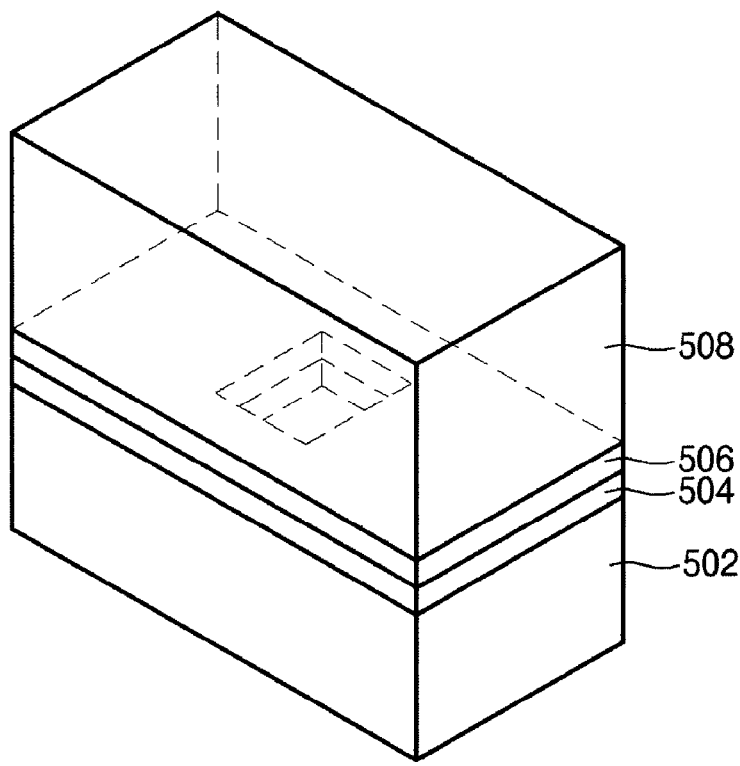

Referring to FIG. 5c, a second silicon film 508 is formed over the structure including the first silicon film 506 and the sacrificial film 504. The second silicon film 508 is completely filled in a region obtained by etching the silicon film 506 and the sacrificial film 504 using the substrate connecting mask.

Figure 5D:
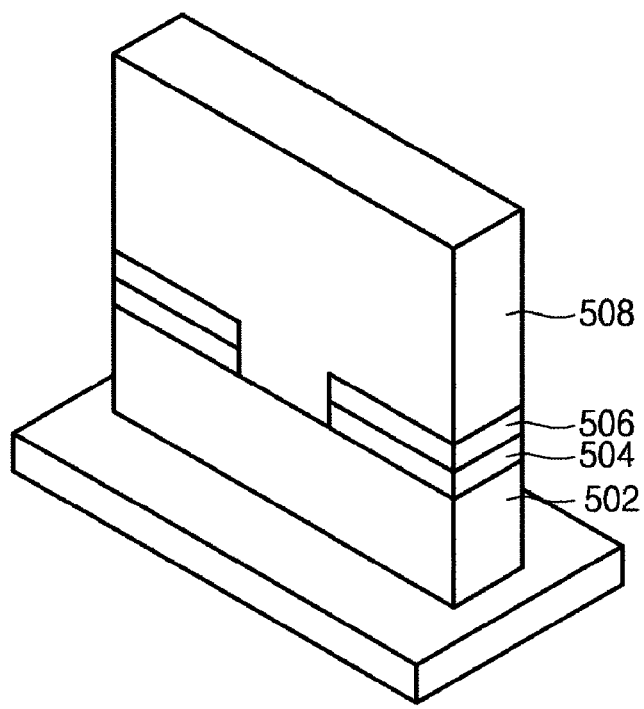

Referring to FIG. 5d, after a pad oxide film (not shown) and a pad nitride film (not shown) are formed over the second silicon film 508, an STI process is performed to form a trench by an etching process using an ISO mask that defines an active region. Specifically, a pad oxide film is formed over the second silicon film 508, and a pad nitride film is deposited over the pad oxide film. After a photoresist film (not shown) is coated over the pad nitride film, the photoresist film is partially removed using the ISO mask 402 or 412 shown in FIGS. 4a and 4b. While the photoresist film is removed, the exposed pad nitride film and pad oxide film are sequentially etched. Then, the second silicon film 508, the sacrificial film 504, and the semiconductor substrate 502 are etched.

Figure 5E:
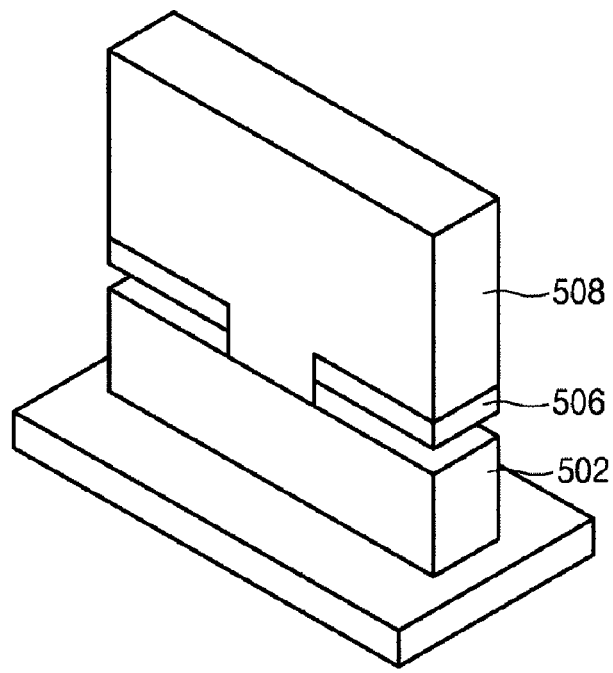

As shown in FIG. 5e, the exposed sacrificial film 504 is selectively wet-etched. For example, when the sacrificial film 504 includes $Si_xGe_{1-x}$ (x is 0.8), the sacrificial film 504 except the semiconductor substrate 502, the first silicon film 506, and the second silicon film 508 are selectively wet-etched using a mixture solution having a composition ratio of $HNO_3$ (70%):HF(49%):$CH_3COOH$(99.9%):$H_2O$=40:1:2:57 which is diluted in $H_2O$ to a proper concentration.

Figure 5F:
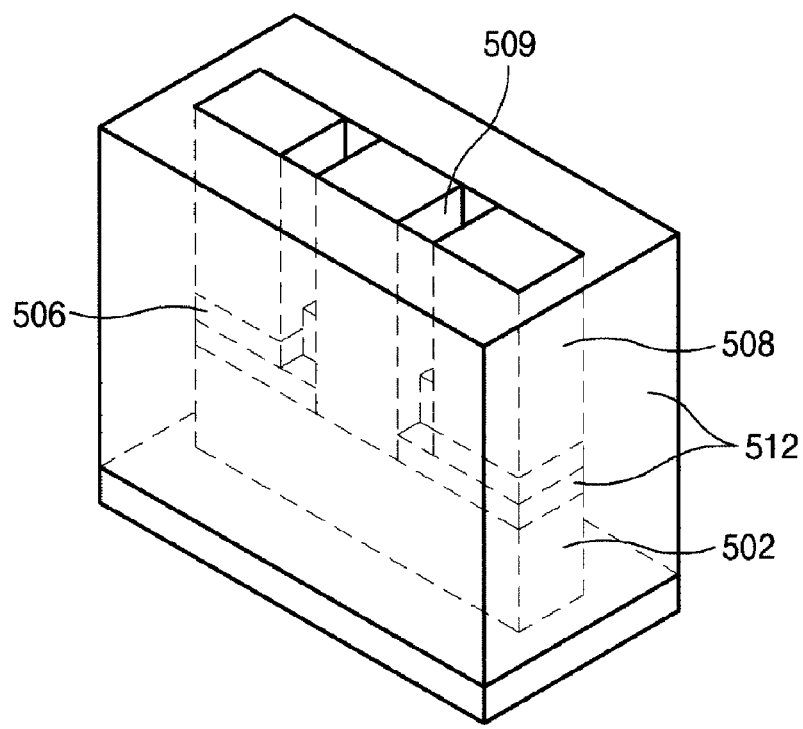

Referring to FIG. 5f, a vacant space formed by the STI process is filled with an isolation insulating film 512. The isolation insulating film 512 is planarized through a chemical mechanical polishing (CMP) process to expose the pad nitride film. The pad nitride film and the pad oxide film that are exposed over the second silicon film 508 are removed by a wet etching process to form a buffer oxide film (not shown). After a photoresist film (not shown) is coated over the resulting structure including the isolation insulating film 512 and the buffer oxide film, the photoresist film is patterned with an ion-implanting mask. An ion-implanting process is performed on the exposed region by the patterned photoresist film, thereby forming a well region and a channel region. After the ion-implanting process, the residual photoresist film is removed.

After a second hard mask film (not shown) is deposited over the resulting structure, a photoresist film (not shown) is coated, and a portion of the photoresist film is removed with the fin mask shown in FIGS. 4a and 4b. After the second hard mask film is etched, the exposed buffer oxide film, the isolation insulating film 512 and the second silicon film 508 are etched. In order to obtain a saddle-type fin transistor, the isolation insulating film 512 is additionally etched to expose the partial insulating region. After a trench 509 is for forming a saddle-type fin channel region through the above-described process, the second photoresist film and the second hard mask film are removed.

Figure 5G:
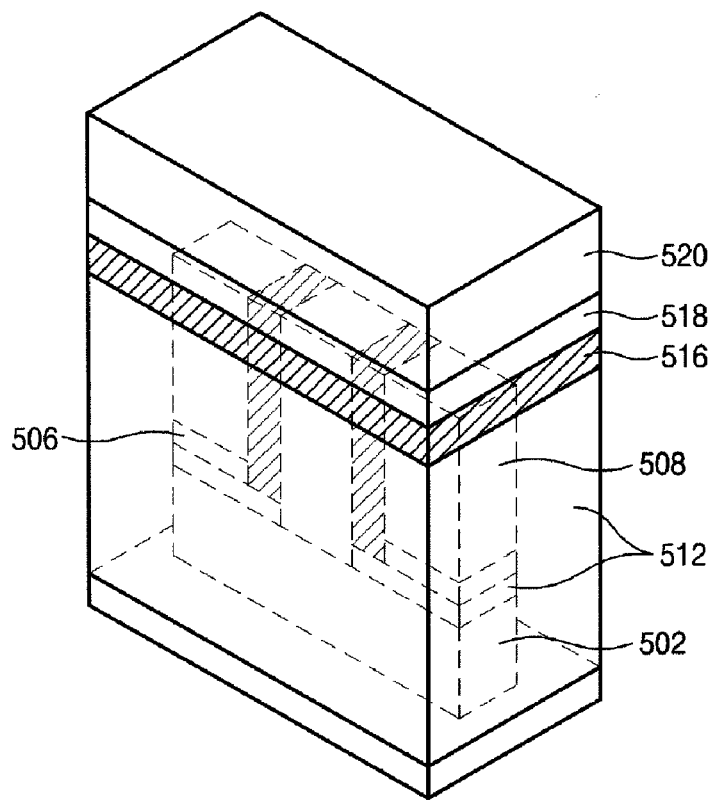

Referring to FIG. 5g, a gate insulating film (not shown) is formed over the first and second silicon films 506 and 508, the semiconductor substrate 502, and the second silicon film 508 exposed by the trench 509. A gate lower electrode 516 and a gate upper electrode 518 are formed over the structure including the gate insulating film. The trench 509 is filled by the gate lower electrode 516 or by the gate lower electrode 516 and the gate upper electrode 518. A gate hard mask film 520 is deposited over the gate upper electrode 518.

Figure 5H:
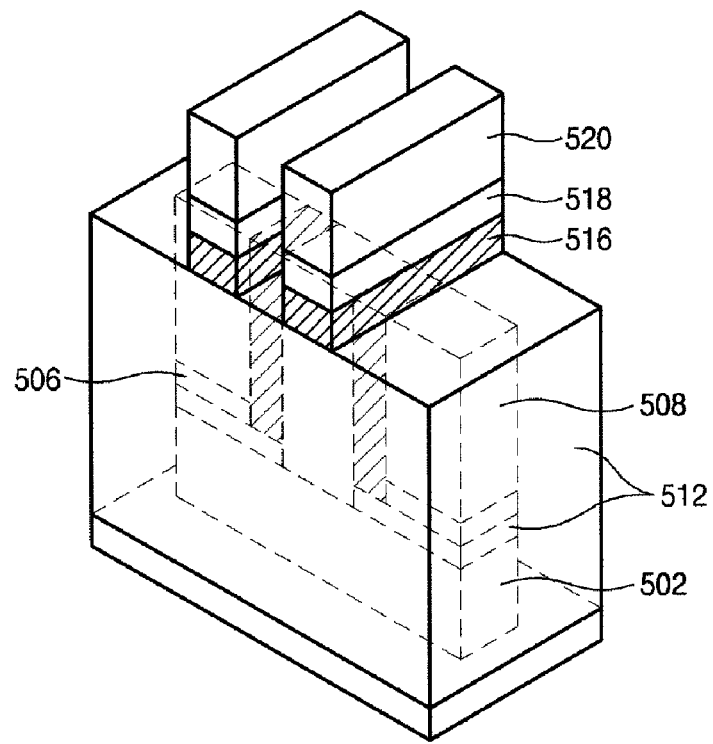

After a third photoresist film (not shown) is coated over the gate hard mask film 520, the third photoresist film is patterned with a gate mask. As shown in FIG. 5h, the gate hard mask film 520, the gate upper electrode 518, and the gate lower electrode 516 are sequentially etched with the third photoresist film. After the gate pattern is completed, the third photoresist film is removed.

In the same way of the process for manufacturing a unit cell of a DRAM, an LDD region of the cell transistor is formed, and a sidewall insulating film is formed at sidewalls of the gate pattern. Thereafter, the process for manufacturing a unit cell of a DRAM including a fin transistor is completed through a process for forming a cell transistor that includes forming a cell contact plug, forming a bit line contact and a bit line, forming a capacitor contact and a capacitor and forming a metal line.

Figure 6:
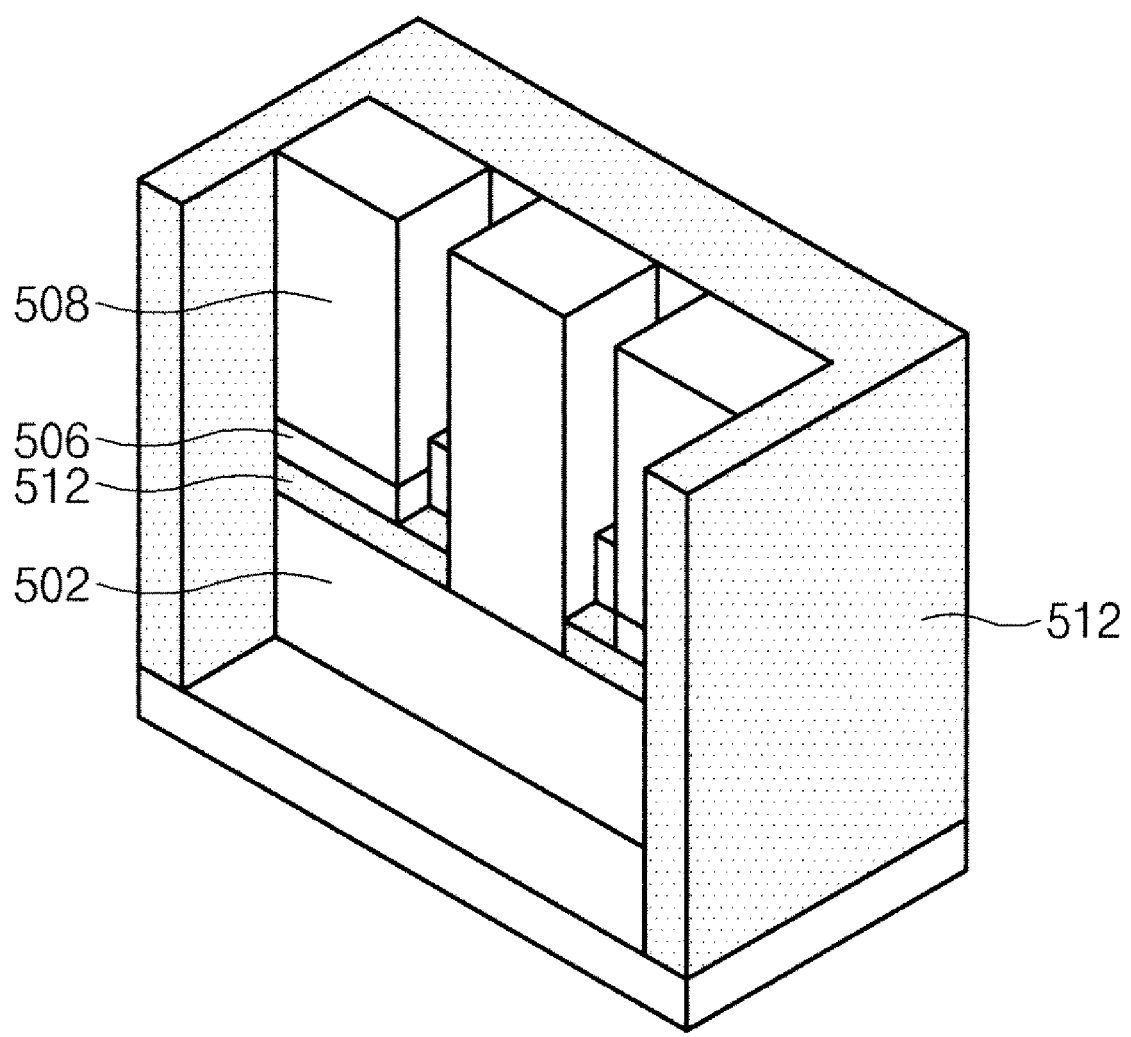
FIG. 6 is a perspective diagram illustrating a characteristic of the semiconductor memory apparatus shown in FIGS. 5a to 5h.

FIG. 6 is a perspective diagram illustrating a characteristic of the semiconductor memory apparatus shown in FIGS. 5a to 5h. Specifically, FIG. 6 shows a cross-section of the perspective diagram shown in FIG. 5f.

In a cross-section of the fin region after the isolation insulating film 512 is formed, the semiconductor substrate 502 is partially insulated from the first and second silicon films 506 and 508 by the isolation insulating film 512. In the semiconductor memory device according to the present embodiment of the invention, the isolation insulating film 512 is formed in the bottom portion of the fin channel region of the saddle-type fin transistor. A channel region (that is, the bottom portion of the bit line contact region) between the two neighboring saddle-type fin transistors is connected to the semiconductor substrate 502 and the second silicon film 508. The region connected to the semiconductor substrate 502 and the second silicon film 508 is defined by the substrate connecting mask 404 or 414 shown in FIGS. 4a and 4b. Thus, the substrate connection region between the isolation insulating films 512 for partial insulation is not etched as shown in FIG. 5b when the sacrificial film 504 is etched with a substrate connecting mask. The residual substrate connection region is removed by a wet etching process, and filled with the isolation insulating film 512.

In one embodiment of the invention formed through the above-described process, it is easy to control the height of the fin region because a partial insulating region is formed in the bottom of the fin channel region of the fin transistor. As a result, the fin region of each transistor has a uniform height, thereby obtaining a uniform and symmetrical channel characteristic of the transistor of the semiconductor device. Also, in the semiconductor device, through the partial insulating region formed in the bottom of the fin channel region of the transistor, a storage node contact region cannot be enlarged by stored charges when data are stored in the unit cell. Thus, the junction area formed between the storage node contact region and a transistor body can be reduced through the partial insulating region, and charges stored in the storage node contact region connected to the capacitor can be prevented from leaking.

However, charges are accumulated in the storage node contact region, and the charges cause a short channel effect such as a punch-through phenomenon between the storage node contact region and the bit line contact region corresponding to source/drain regions of the transistor, so that a doping concentration is required to increase in the channel region. Specifically, when data are stored in the unit cell, the source/drain region (N-type doping region) where a storage node contact is formed by the stored charges is extended to a transistor body region (P-type doping region). When the extended source/drain regions contact the partial insulating film in the bottom portion, the stored charges are trapped by the partial insulating film. When the charges are trapped by the partial insulating film, the channel doping concentration is required to increase in the bottom portion of the fin channel region in order to prevent the short channel effect, and leakage current may increase when the channel doping concentration increases. Consequently, in the semiconductor device according to one embodiment of the invention, the partial insulating region is formed to the bottom portion of the storage node contact region as well as to the bottom portion of the fin channel region, so that the leakage current cannot be prevented. Hereinafter, a semiconductor memory apparatus according to another embodiment of the invention for preventing the leakage current and improving the threshold voltage characteristic is described.

Figure 7A:
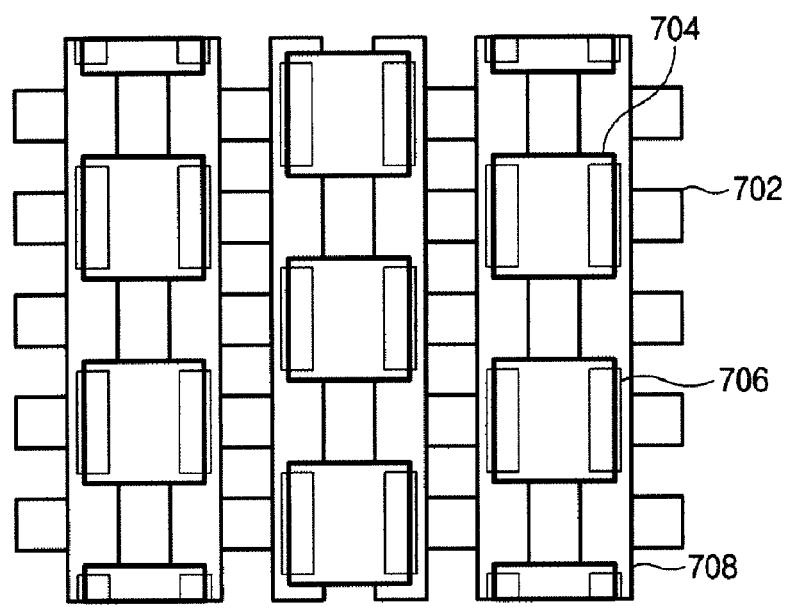
FIGS. 7a and 7b are plane diagrams illustrating a mask structure for fabricating a semiconductor memory apparatus according to an embodiment of the invention.
Figure 7B:
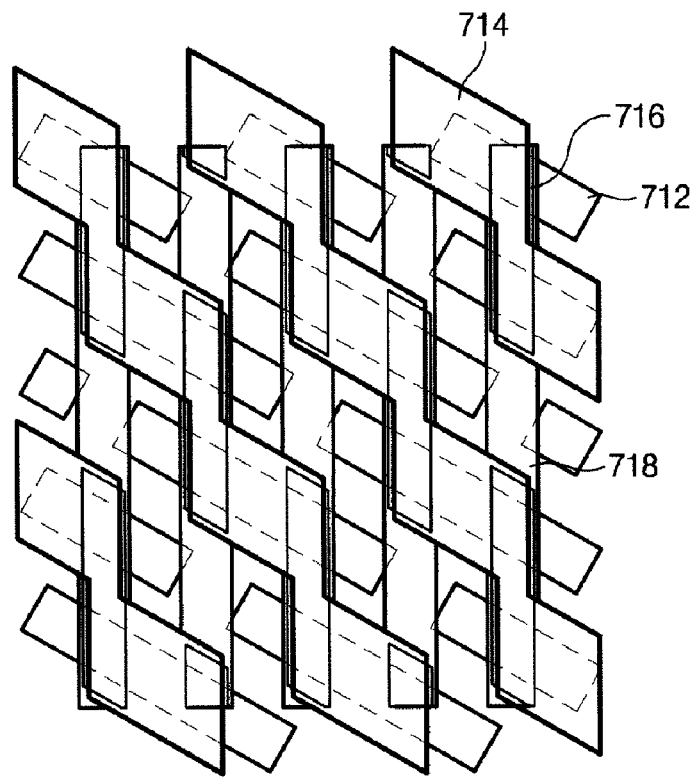

FIGS. 7a and 7b are plane diagrams illustrating a mask structure for fabricating a semiconductor memory apparatus according to an embodiment of the invention. Specifically, FIG. 7a shows an ISO mask 702, a substrate connecting mask 704, a fin mask 706, and a gate mask 708 for manufacturing a unit cell of 8 $F^2$ including a fin transistor. FIG. 7b shows an ISO mask 712, a substrate connecting mask 714, a fin mask 716, and a gate mask 718 for manufacturing a unit cell of 6 $F^2$.

While the silicon layer is formed in the region corresponding to the substrate connecting mask 404 or 414 by an epitaxial growth or silicon deposition method in the embodiment of the invention shown in FIGS. 4a and 4b, an insulating film is formed in a region corresponding to the substrate connecting mask 704 or 714 referring to FIGS. 7a and 7b. Specifically, the substrate connecting mask 404 or 414 includes exposed regions, each having a larger area than both a region between the fin regions formed at the bottom of neighboring gate patterns in a horizontal direction and the active region in a vertical direction. As a result, an insulating film is not formed in a storage node contact region of the active region which does not correspond to the substrate connecting mask 704 or 714.

Hereinafter, a method is described for fabricating a semiconductor device for forming a saddle-type fin transistor including a fin region over a partial insulating substrate using a mask as shown in FIGS. 7a and 7b.

FIGS. 8a to 8h are perspective diagrams illustrating a method for fabricating a semiconductor memory apparatus using a mask pattern shown in FIGS. 7a and 7b.

Figure 8A:
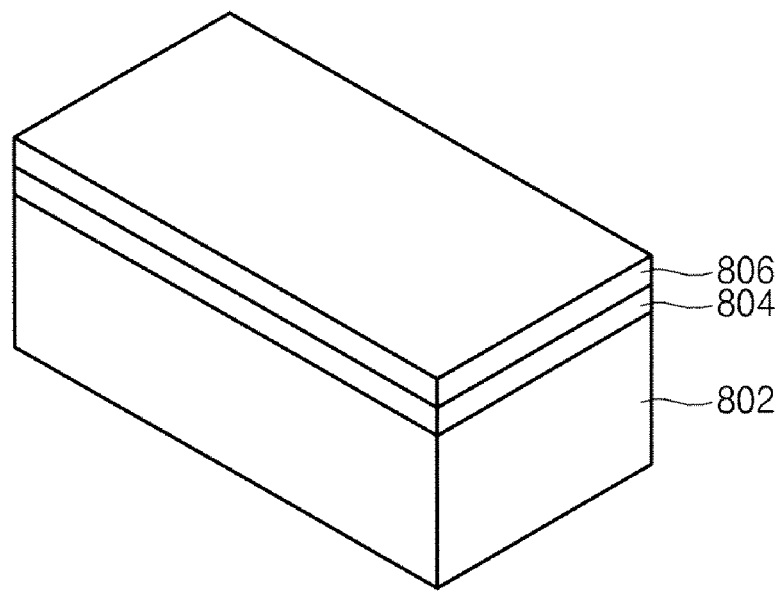

Referring to FIG. 8a, a sacrificial film 804 is formed over a semiconductor (e.g., Si or SiGe) substrate 802. A first silicon film 806 is formed over the sacrificial film 804, and a first hard mask film (not shown) is formed over the first silicon film 806. The sacrificial film 804 has a different wet etching selectivity from that of the semiconductor substrate 802 and the first silicon film 806 as well as a lattice constant value that is not much different from that of the first silicon film 806.

Figure 8B:
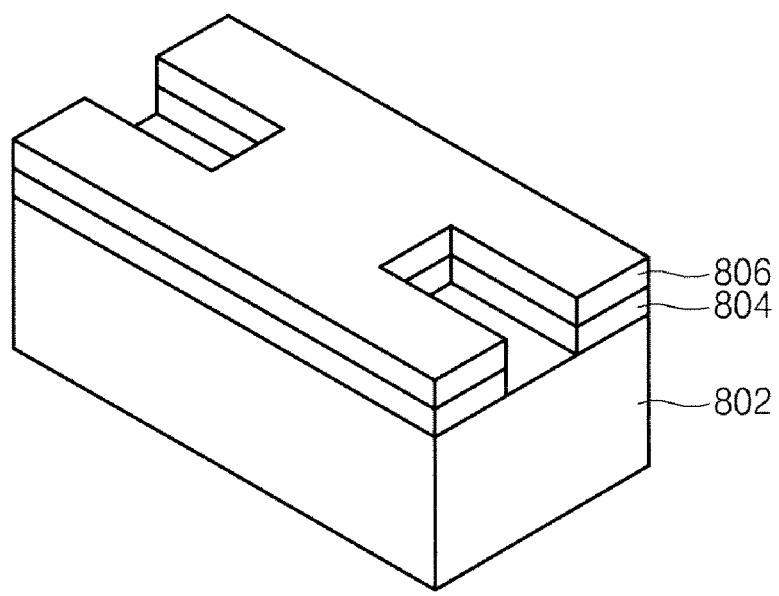

After a first photoresist film (not shown) is coated over a first hard mask film, the photoresist film is patterned using the substrate connecting mask 804 or 814 shown in FIGS. 7a and 7b. The first hard mask film is etched using a second photoresist film, and the first silicon film 806 and the sacrificial film 804 are etched as shown in FIG. 8b.

Figure 8C:
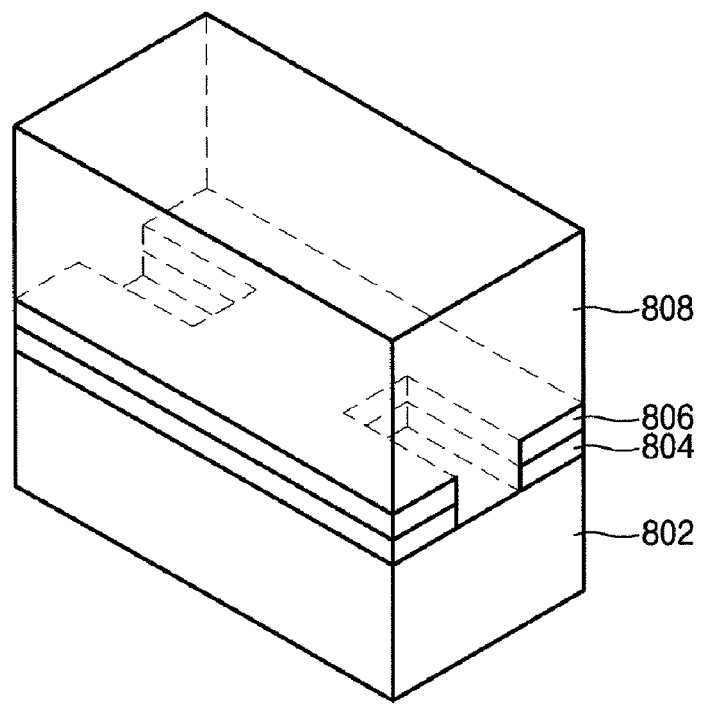

Referring to FIG. 8c, a second silicon film 808 is formed over the structure including the first silicon film 806 and the sacrificial film 804. The second silicon film 808 is completely filled in a region obtained by etching the silicon film 806 and the sacrificial film 804 using the substrate connecting mask.

Figure 8D:
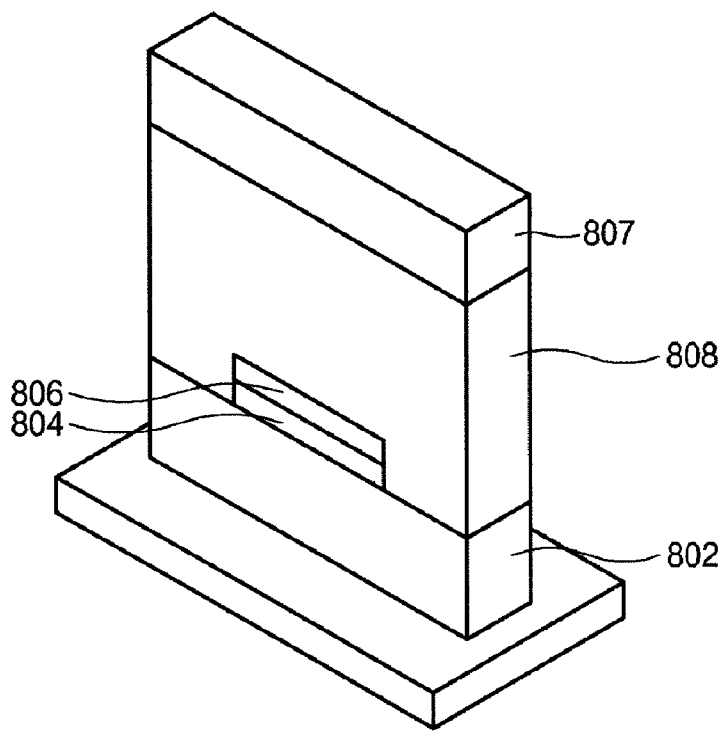

Referring to FIG. 8d, after a pad oxide film (not shown) and a pad nitride film (not shown) are formed over the second silicon film 808, an STI process is performed to form a trench by an etching process using an ISO mask that defines an active region. Specifically, a pad oxide film is formed over the second silicon film 808, and a pad nitride film is deposited over the pad oxide film. After a photoresist film (not shown) is coated over the pad nitride film, the photoresist film is partially removed using the ISO mask 802 or 812 shown in FIGS. 7a and 7b, thereby forming a photoresist pattern 807. The pad nitride film (not shown) and the pad oxide film (not shown) exposed by the photoresist pattern 807 are sequentially etched. Then, the second silicon film 808, the sacrificial film 804 and the semiconductor substrate 802 are etched.

Figure 8E:
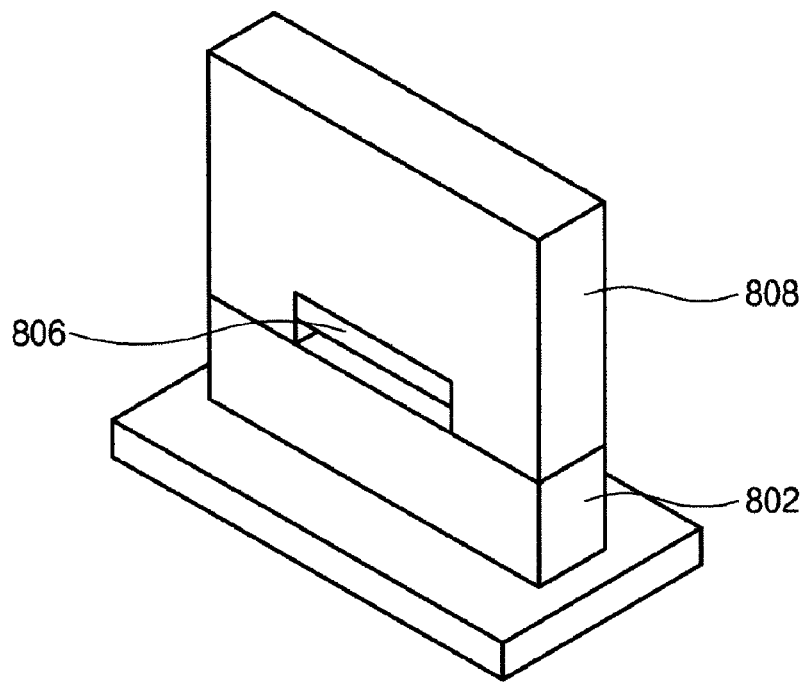

As shown in FIG. 8e, the exposed sacrificial film 804 is selectively wet-etched. For example, when the sacrificial film 804 includes $Si_xGe_{1-x}$ (x is 0.8), the sacrificial film 804 except the semiconductor substrate 802, the first silicon film 806 and the second silicon film 808 is selectively wet-etched using a mixture solution having a composition ratio of $HNO_3(70\%)$:$HF(49\%)$:$CH_3COOH(99.9\%)$:$H_2O$=40:1:2:57 which is diluted in $H_2O$ to a proper concentration.

Figure 8F:
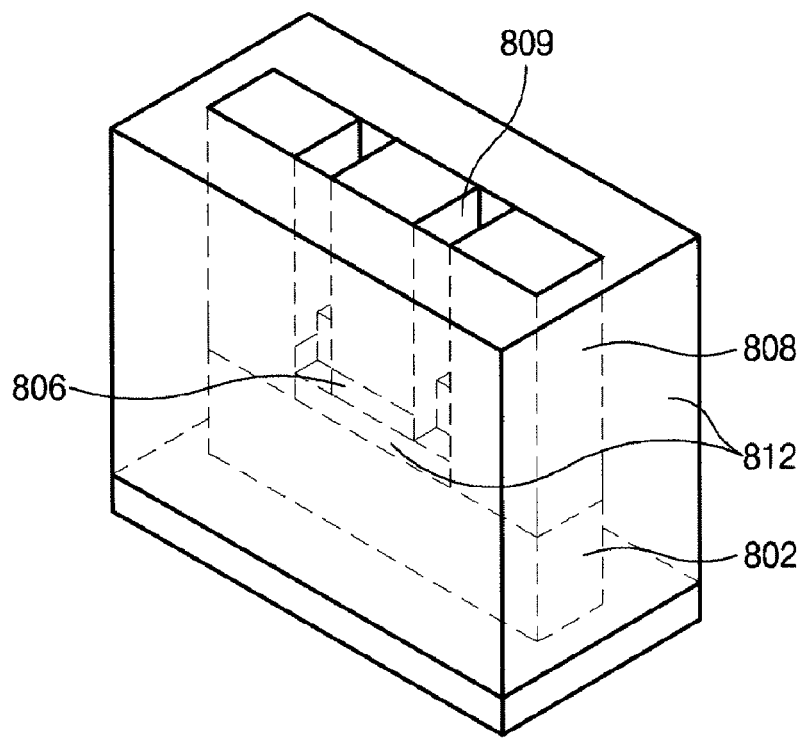

Referring to FIG. 8f, a vacant space formed by the STI process is filled with an isolation insulating film 812. The isolation insulating film 812 is planarized through a chemical mechanical polishing (CMP) process to expose the pad nitride film. The pad nitride film and the pad oxide film which are exposed over the second silicon film 808 are removed by a wet etching process to form a buffer oxide film (not shown). After a photoresist film (not shown) is coated over the resulting structure including the isolation insulating film 812 and the buffer oxide film, the photoresist film is patterned with an ion-implanting mask. An ion-implanting process is performed on the exposed region by the patterned photoresist film, thereby forming a well region and a channel region. After the ion-implanting process, the residual photoresist film is removed.

After a second hard mask film (not shown) is deposited over the resulting structure, a photoresist film (not shown) is coated, and a portion of the photoresist film is removed with the fin mask shown in FIGS. 7a and 7b. After the second hard mask film is etched, the exposed buffer oxide film, the isolation insulating film 812, and the second silicon film 808 are etched. In order to obtain a saddle-type fin transistor, the isolation insulating film 812 is additionally etched to expose the partial insulating region. After a trench 809 is for forming a saddle-type fin channel region through the above-described process, the second photoresist film and the second hard mask film are removed.

Figure 8G:
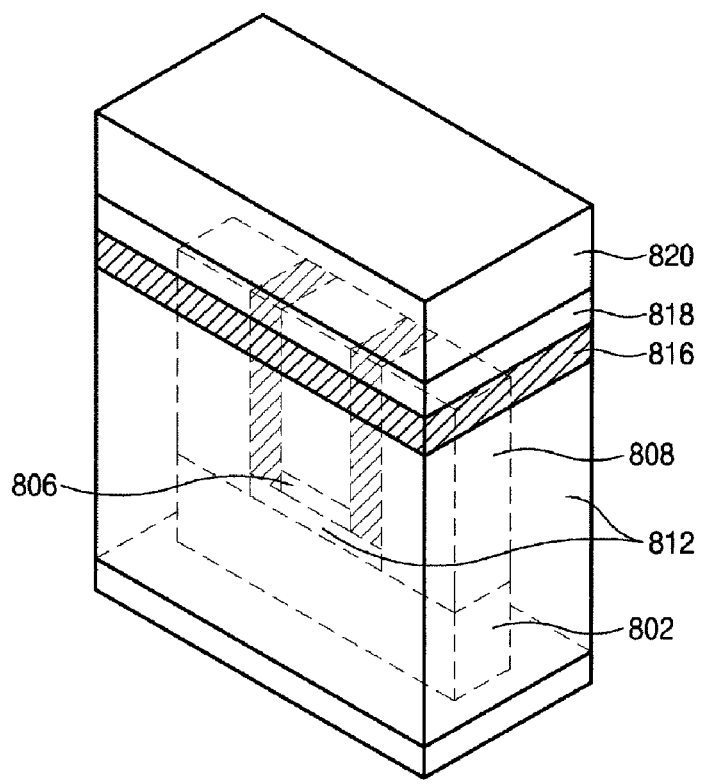

Referring to FIG. 8g, a gate insulating film (not shown) is formed over the first and second silicon films 806 and 808, the semiconductor substrate 802 and the second silicon film 808 are exposed by the trench 809. A gate lower electrode 816 and a gate upper electrode 818 are formed over the structure including the gate insulating film. The trench 809 is filled by the gate lower electrode 816 or by the gate lower electrode 816 and the gate upper electrode 818. A gate hard mask film 820 is deposited over the gate upper electrode 818.

Figure 8H:
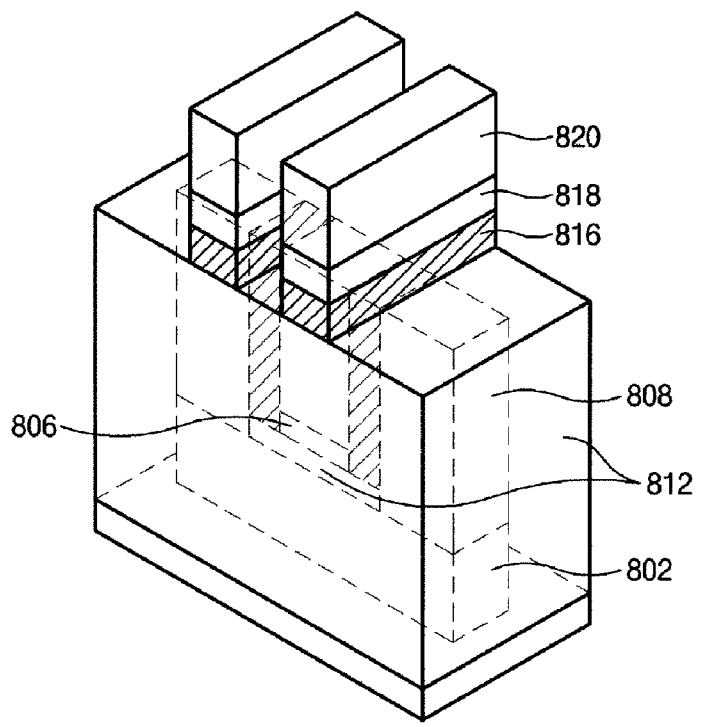

After a third photoresist film (not shown) is coated over the gate hard mask film 820, the third photoresist film is patterned with a gate mask. As shown in FIG. 8h, the gate hard mask film 820, the gate upper electrode 818, and the gate lower electrode 816 are sequentially etched with the third photoresist film. After the gate pattern is completed, the third photoresist film is removed.

Using a similar process as manufacturing a unit cell of a DRAM, an LDD region of the cell transistor is formed, and a sidewall insulating film is formed at sidewalls of the gate pattern. Thereafter, the process for manufacturing a unit cell of a DRAM including a fin transistor is completed through a process for forming a cell transistor that includes forming a cell contact plug, forming a bit line contact and a bit line, forming a capacitor contact and a capacitor and forming a metal line.

Figure 9:
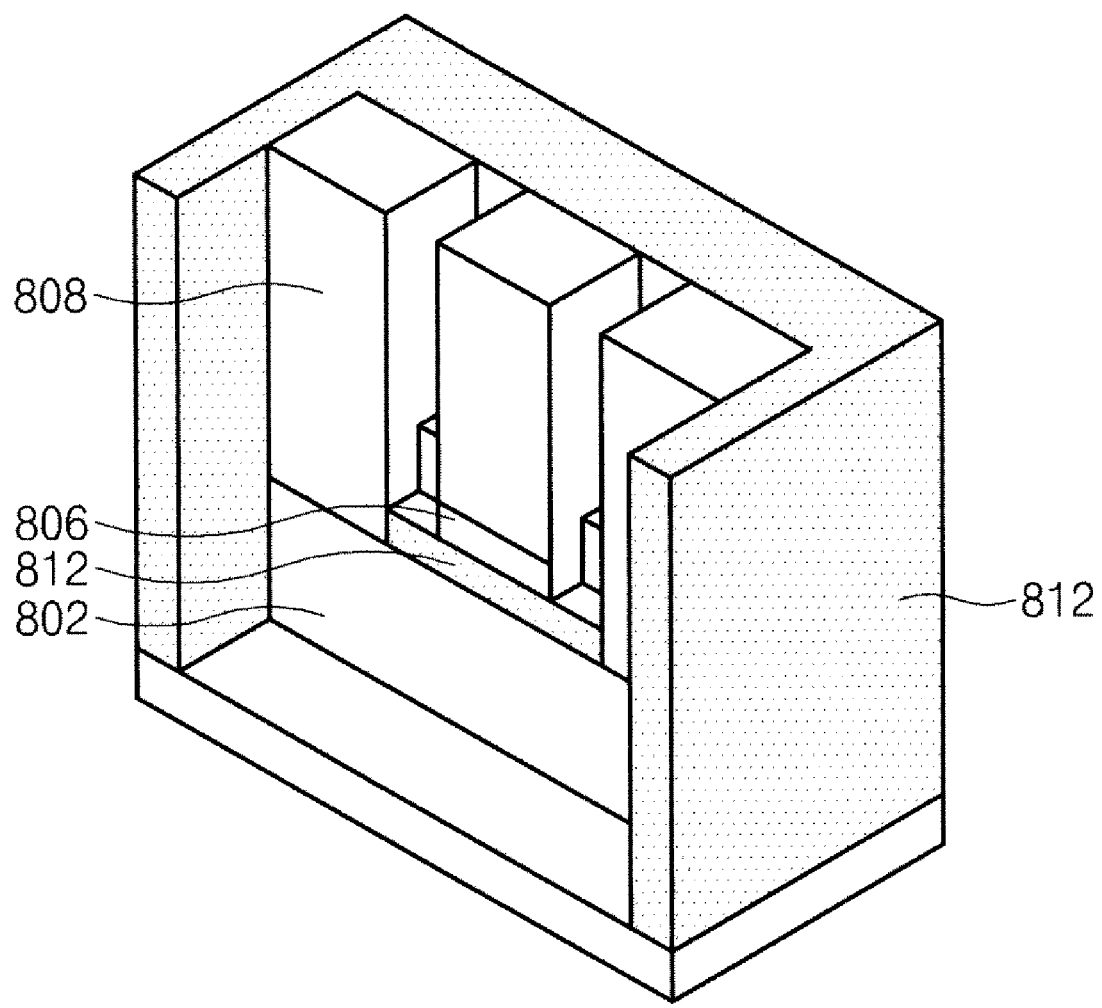
FIG. 9 is a perspective diagram illustrating a characteristic of the semiconductor memory apparatus shown in FIGS. 8a to 8h.

FIG. 9 is a perspective diagram illustrating a characteristic of the semiconductor memory apparatus shown in FIGS. 8a to 8h.

In a cross-section of the fin region after the isolation insulating film 812 is formed, the semiconductor substrate 802 is partially insulated from the first and second silicon films 806 and 808 by the isolation insulating film 812. In the semiconductor memory device according to the embodiment of the invention, the isolation insulating film 812 is formed in the bottom portion of the fin channel region of the saddle-type fin transistor. The semiconductor substrate 802 and the second silicon film 808 are connected in the bottom portion of the storage node contact region located at the outside of the channel region of the two neighboring saddle-type fin transistors. The region connected to the semiconductor substrate 802 and the second silicon film 808 is not defined by the substrate connecting mask 704 or 714 shown in FIGS. 7a and 7b, but includes the bottom portion of the channel region and the bit line contact region. Thus, the substrate connection region between the isolation insulating films 712 for partial insulation is not etched as shown in FIG. 8b when the sacrificial film 804 is etched with a substrate connecting mask. The residual substrate connection region is removed by a wet etching process, and filled with the isolation insulating film 812.

Figure 10:
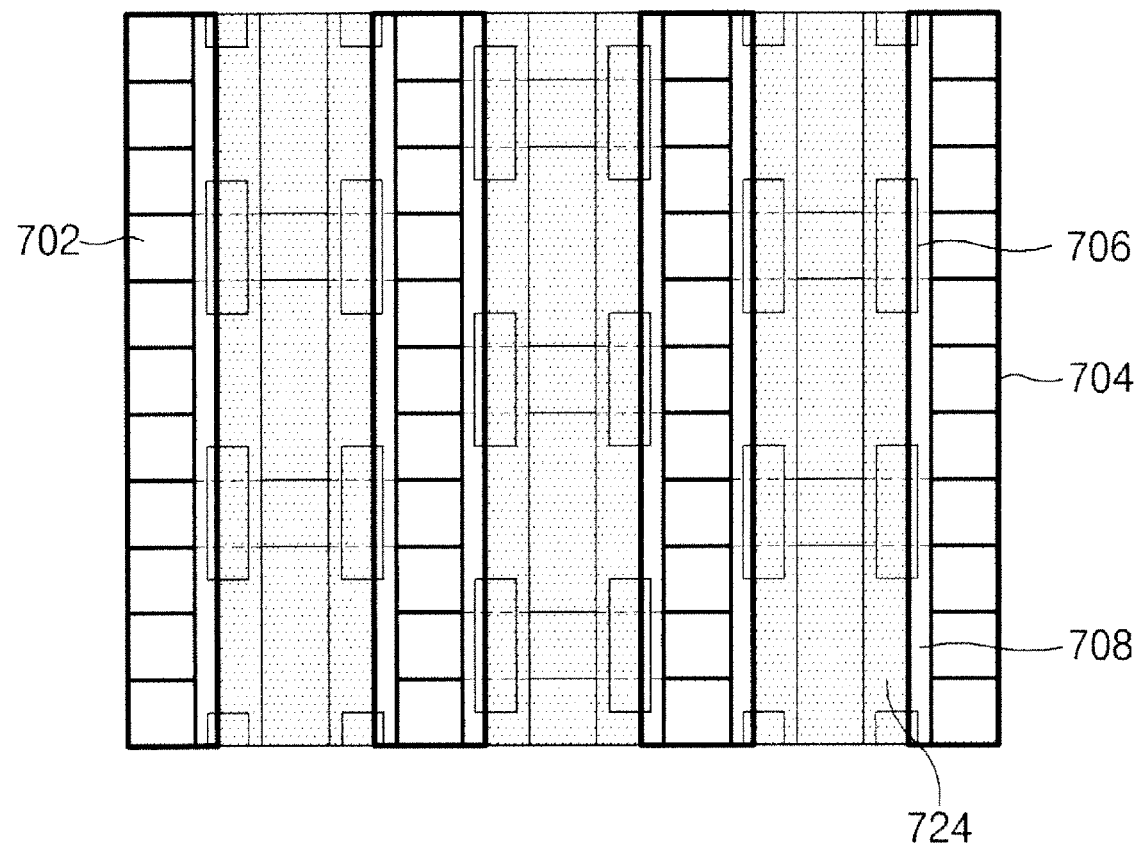
FIG. 10 is a plane diagram illustrating a mask structure for fabricating a semiconductor memory apparatus according to an embodiment of the invention.

FIG. 10 is a plane diagram illustrating a mask structure for fabricating a semiconductor memory apparatus according to an embodiment of the invention.

The substrate connecting mask 724 has a line-type pattern unlike the substrate connecting mask 704 or 714 shown in FIGS. 7a and 7b. Specifically, the width of the substrate connecting mask 724 may be defined as a range including a partial or the whole portion of the region where the gate pattern and the bit line contact region between the neighboring gate patterns formed over the active region. The width of the substrate connecting mask 724 may not include the rest of the active region located at the outside of the neighboring gate pattern.

Figure 11A:
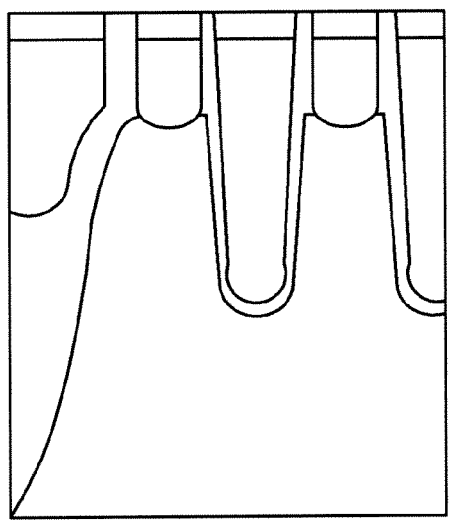
FIGS. 11a and 11b are diagrams and graphs illustrating differences between a general semiconductor device and the semiconductor memory apparatus shown in FIGS. 8a to 8h.
Figure 11A:
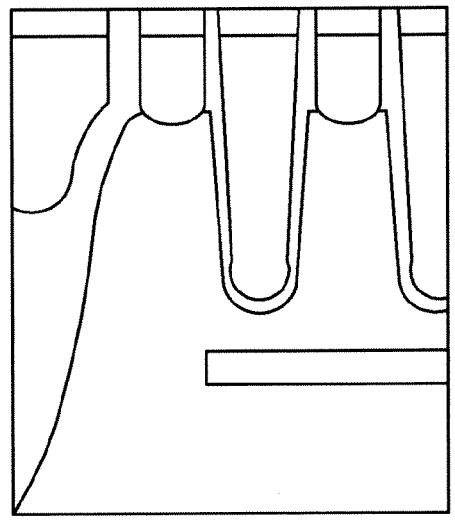
Figure 11B:
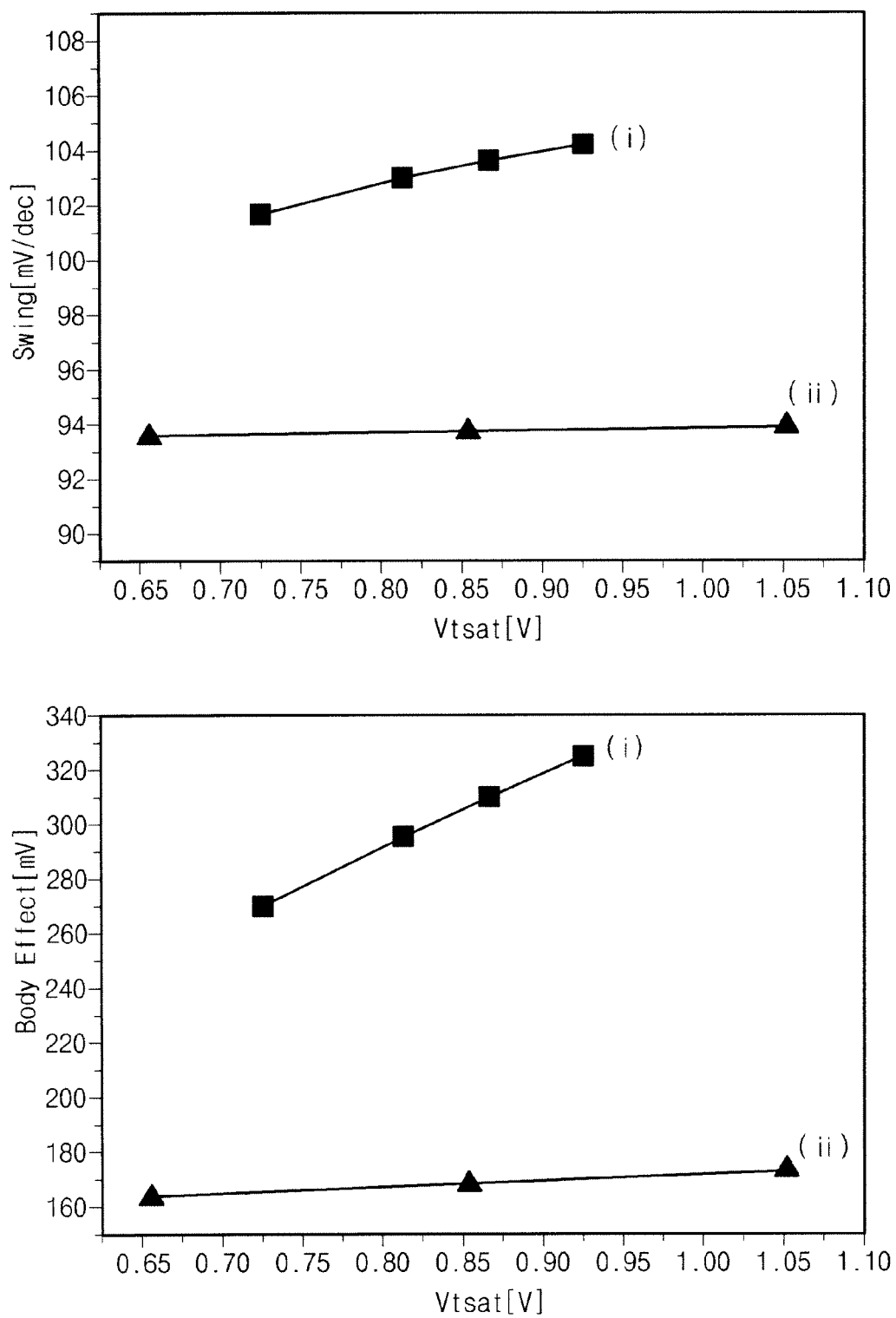

FIGS. 11a and 11b include diagrams and graphs illustrating differences between a general semiconductor device and the semiconductor memory apparatus shown in FIGS. 8a to 8h. Specifically, FIG. 11a shows cross-sections of the saddle-type fin transistor including the partial insulating film formed in the bottom portion of the neighboring gate pattern as well as the bit line contact region and the saddle-type fin transistor which does not include the partial insulating film. FIG. 11b shows text results on the body effect and the swing of the threshold voltage of the transistor.

Referring to FIG. 11b, the swing and the body effect of the saddle-type fin transistor including the partial insulating film are shown to be improved rather than those of the conventional saddle-type fin transistor that does not include the partial insulating film. A small value of the swing means that a fluctuation of the threshold voltage in the transistor is small, and that the operation of the transistor performs in a stable manner. In the same way, the body effect for increasing the threshold voltage becomes small by a backward bias generated between a source region of the transistor and the semiconductor substrate (body). Thus, the threshold voltage of the transistor does not increase, so that the transistor can be operated in a stable manner.

Referring to FIG. 9, the isolation insulating film 812 is formed in the bottom portion of the channel region and the bit line contact region in the semiconductor memory apparatus according to one embodiment of the invention. However, in another embodiment of the invention, the isolation insulating film 812 is formed in the bottom portion of the bit line contact region and a partial region of the channel region, or the isolation insulating film 812 corresponding to the partial insulating film is formed in a portion of the bottom portion of the storage node contact region as well as in the bottom portion of the bit line contact region and the channel region. Although there is a difference in the body effect and the swing of the threshold voltage depending on the range where the partial insulating film is formed, the body effect and the swing of the threshold voltage can be improved in the above-described embodiment of the invention rather than in the saddle-type fin transistor formed over the semiconductor substrate which does not include the partial insulating film.

In one embodiment of the invention, the partial insulating region is formed in the bottom portion of the fin channel region and the bit line contact region, thereby preventing increase of leakage current and stabilizing the threshold voltage of the transistor.

Also, the partial insulating region is formed in the bottom portion of the fin channel region of the saddle-type fin transistor and a general fin transistor, so that the height of the fin region between the neighboring transistors becomes uniform, thereby obtaining a uniform and symmetrical channel characteristic of the transistor of the semiconductor device.

Furthermore, due to the partial insulating region formed in the bottom portion of the fin channel region of the transistor, the short channel effect such as a punch-through phenomenon between the storage node contact region and the bit line contact region corresponding to source/drain regions of the transistor can be prevented.

The above embodiments of the invention are illustrative and not limiting. Various alternatives and equivalents are possible. The invention is not limited by the type of deposition, etching polishing, and patterning steps describe herein, nor is the invention limited to any specific type of semiconductor device. For example, the invention may be implemented in a dynamic random access memory (DRAM) device or non volatile memory device. Other additions, subtractions, or modifications are intended to fall within the scope of the appended claims.

What is claimed is:
1. A method for fabricating a semiconductor device, comprising:
   forming a partial-insulated substrate comprising an insulating region located below and fully overlapped vertically by both (a) at least one channel region of at least one cell transistor and (b) one of a storage node contact region or a bit line contact region; and forming a cell transistor comprising a fin region on the partial-insulated substrate, wherein the bit line contact region comprises an area between fin regions of neighboring cell transistors formed in an active region, and the storage node contact region comprises areas outside the fin regions of the neighboring cell transistors formed in the active region.

2. The method according to claim 1, comprising forming the partial-insulated substrate by:

forming a connection region below one of the storage node contact region and the bit line contact region, wherein the connection region is configured to connect an upper silicon layer to a lower semiconductor substrate; and forming the active region in the partial-insulated substrate and concurrently forming the insulating region.

3. The method according to claim 2, comprising forming the connection region by:

depositing a sacrificial layer on the lower semiconductor substrate;

forming a first silicon layer on the sacrificial layer;

etching the first silicon layer and the sacrificial layer to define the connection region; and forming a second silicon layer on the first silicon layer and the lower semiconductor substrate, wherein the second silicon layer corresponds to the connection region and the upper silicon layer.

4. The method according to claim 3, comprising defining the active region in the partial insulated substrate and concurrently forming the insulating region by:

forming a trench through a Shallow Trench Isolation (STI) process to expose the sacrificial layer using an ISO mask configured to define the active region;

performing a wet-etch process on the sacrificial layer exposed by the trench to form the insulating region; and forming an isolation insulating layer in the trench and the insulating region.

5. The method according to claim 4, wherein the sacrificial layer comprises $Si_{0.8}Ge_{0.2}$, and an etchant used during the wet etch process comprises $HNO_3$(70% purity), HF(49% purity), $CH_3COOH$(99.9% purity), and $H_2O$, wherein a ratio of $HNO_3$:HF:$CH_3COOH$:$H_2O$ is 40:1:2:57.

6. The method according to claim 4, wherein the sacrificial layer has an etch selectivity different from respective etch selectivities of the upper silicon layer and the lower semiconductor substrate.

* * * * *